(12) United States Patent
Takaya et al.

(10) Patent No.: US 10,153,345 B2
(45) Date of Patent: Dec. 11, 2018

(54) INSULATED GATE SWITCHING DEVICE AND METHOD FOR MANUFACTURING THE SAME

(71) Applicants: TOYOTA JIDOSHA KABUSHIKI KAISHA, Toyota-shi, Aichi (JP); DENSO CORPORATION, Kariya-shi, Aichi (JP)

(72) Inventors: Hidefumi Takaya, Toyota (JP); Shoji Mizuno, Kariya (JP); Yukihiko Watanabe, Nagakute (JP); Sachiko Aoi, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/576,740

(22) PCT Filed: Jun. 3, 2016

(86) PCT No.: PCT/JP2016/002704
§ 371 (c)(1),
(2) Date: Nov. 24, 2017

(87) PCT Pub. No.: WO2016/199390
PCT Pub. Date: Dec. 15, 2016

(65) Prior Publication Data
US 2018/0175149 A1    Jun. 21, 2018

(30) Foreign Application Priority Data

Jun. 11, 2015 (JP) .................................. 2015-118389

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02529* (2013.01); *H01L 21/046* (2013.01);
(Continued)

(58) Field of Classification Search
None
See application file for complete search history.

(56) References Cited

U.S. PATENT DOCUMENTS 5,719,409 A * 2/1998 Singh ................. H01L 29/1095
257/328
6,020,600 A 2/2000 Miyajima et al.
(Continued)

FOREIGN PATENT DOCUMENTS

JP      2013-191734 A    9/2013
TW        201242009 A   10/2012

*Primary Examiner* — Lex Malsawma
(74) *Attorney, Agent, or Firm* — Oliff PLC

(57) ABSTRACT

A method for manufacturing an insulated gate switching device is provided. The method includes: forming a first trench in a surface of a first SiC semiconductor layer; implanting p-type impurities into a bottom surface of the first trench; depositing a second SiC semiconductor layer on an inner surface of the first trench to form a second trench; and forming a gate insulating layer, a gate electrode, a first region and a body region so that the gate insulating layer covers an inner surface of the second trench, the gate electrode is located in the second trench, the first region is of n-type and in contact with the gate insulating layer, the body region is of p-type, separated from the implanted region, and in contact with the gate insulating layer under the first region.

7 Claims, 26 Drawing Sheets

(51) Int. Cl.
- *H01L 29/423* (2006.01)
- *H01L 29/66* (2006.01)
- *H01L 29/739* (2006.01)
- *H01L 29/78* (2006.01)
- *H01L 29/06* (2006.01)
- *H01L 29/10* (2006.01)
- *H01L 21/04* (2006.01)
- *H01L 29/36* (2006.01)

(52) U.S. Cl.
CPC ........ *H01L 21/049* (2013.01); *H01L 21/0475* (2013.01); *H01L 29/0623* (2013.01); *H01L 29/1095* (2013.01); *H01L 29/36* (2013.01); *H01L 29/4236* (2013.01); *H01L 29/42368* (2013.01); *H01L 29/66068* (2013.01); *H01L 29/66348* (2013.01); *H01L 29/66734* (2013.01); *H01L 29/7397* (2013.01); *H01L 29/7813* (2013.01)

(56) References Cited

U.S. PATENT DOCUMENTS

| | | | |
|---|---|---|---|
| 2007/0096172 A1* | 5/2007 | Tihanyi | H01L 29/0623 257/288 |
| 2010/0224932 A1* | 9/2010 | Takaya | H01L 29/0623 257/330 |
| 2012/0187478 A1 | 7/2012 | Takaya | |
| 2012/0228640 A1* | 9/2012 | Masuda | H01L 29/045 257/77 |
| 2012/0248462 A1 | 10/2012 | Wada et al. | |
| 2015/0084124 A1* | 3/2015 | Saito | H01L 29/4236 257/330 |
| 2015/0129957 A1* | 5/2015 | Takaya | H01L 29/7827 257/330 |
| 2016/0099316 A1* | 4/2016 | Arai | H01L 29/1033 257/77 |
| 2016/0218190 A1* | 7/2016 | Fukuoka | H01L 29/4236 |
| 2017/0012121 A1* | 1/2017 | Saito | H01L 21/047 |

* cited by examiner

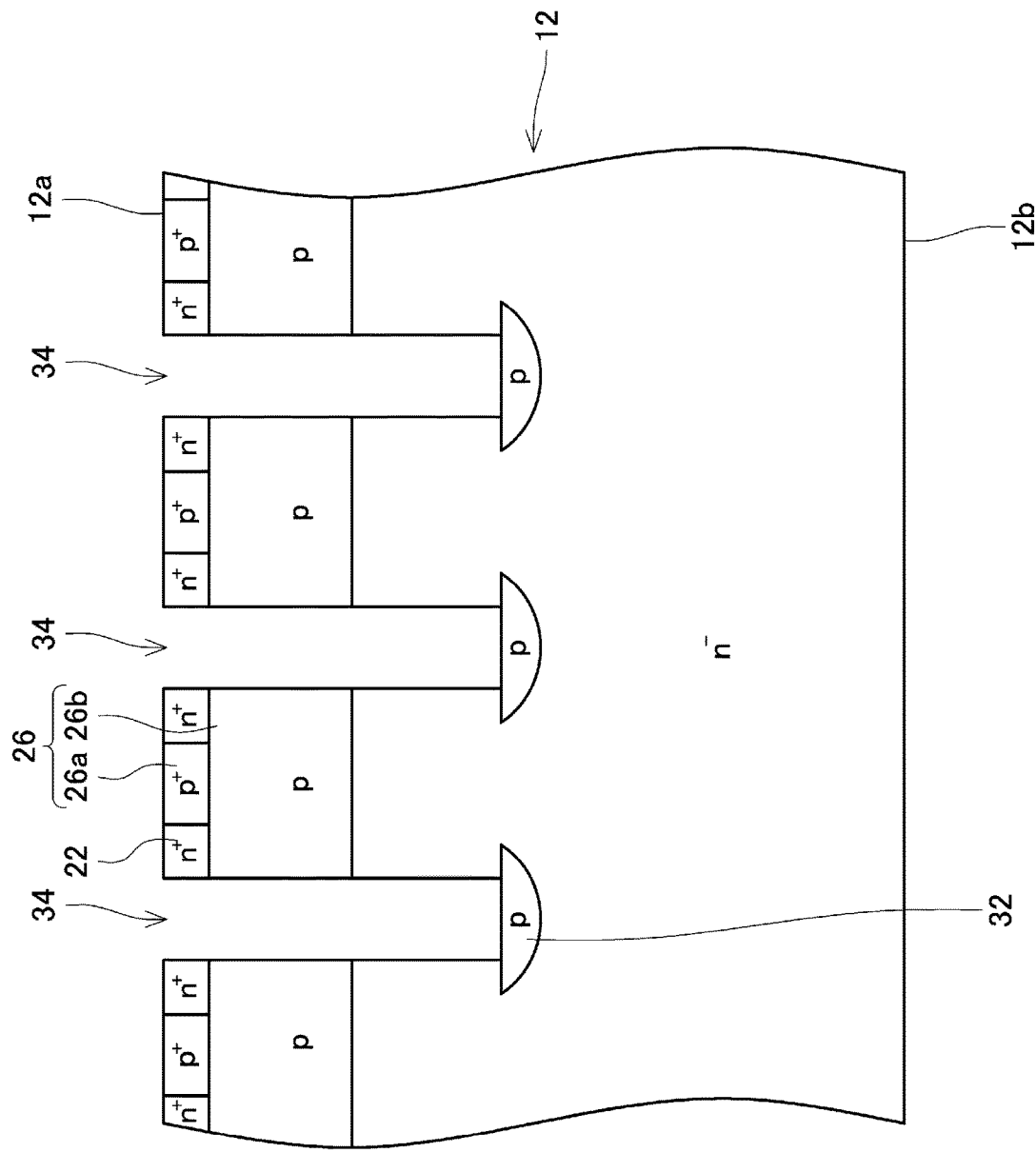

INSULATED GATE SWITCHING DEVICE AND METHOD FOR MANUFACTURING THE SAME

CROSS-REFERENCE TO RELATED APPLICATION

This application claims priority to Japanese Patent Application No. 2015-118389 filed on Jun. 11, 2015, the entire contents of which are hereby incorporated by reference into the present application.

TECHNICAL FIELD

A technology disclosed herein relates to an insulated gate switching device and a method for manufacturing the same.

BACKGROUND ART

An insulated gate switching device such as a MOSFET (metal oxide semiconductor field effect transistor) or an IGBT (Insulated Gate Bipolar Transistor) has been known. While the insulated gate switching device is turned off, an electric field is applied to a gate insulating film. If the electric field applied to the gate insulating film exceeds an insulation resistance of the gate insulating film, a current flows penetrating the gate insulating film, which is problematic. Accordingly, a technique to relax an electric field applied to the gate insulating film is needed.

Japanese Patent Application Publication No. 2013-191734 A discloses an insulated gate switching device formed in a SiC semiconductor substrate. This insulated gate switching device has a trench-type gate electrode. An electric field relaxation region of p-type is formed under the trench. When the insulated gate switching device is turned off, a depletion layer spreads from the electric field relaxation region to a drift region (an n-type region) on the periphery thereof. With the depletion layer spreading from the electric field relaxation region to the drift region, the electric field applied to the gate insulating film is relaxed.

SUMMARY OF INVENTION

In the method for manufacturing the insulated gate switching element in Japanese Patent Application Publication No. 2013-191734 A, a trench is formed in a front surface of the SiC semiconductor substrate, and then p-type impurities are implanted into a bottom surface of the trench. An electric field relaxation region of p-type is thereby formed under the trench. Afterwards, a gate insulating layer and a gate electrode are formed in the trench. Here, the p-type impurities in the SiC semiconductor substrate have a small diffusion coefficient. Accordingly, in the manufacturing method in Japanese Patent Application Publication No. 2013-191734 A, the p-type impurities implanted into the SiC semiconductor substrate when the electric field relaxation region is formed are not so much diffused from the implanted region, and most part of the electric field relaxation region is formed in a region under the trench. Accordingly, a width of a portion of the electric field relaxation region that protrudes from below the trench in a lateral direction with respect to a lateral surface of the trench (hereinafter referred to as a protruding amount) is small. If the protruding amount of the electric field relaxation region is small, an effect of suppressing an electric field applied to the gate insulating layer is disadvantageously decreased. Accordingly, the present disclosure provides a method for manufacturing an insulated gate switching device, capable of increasing a protruding amount of the electric field relaxation region.

A method disclosed herein is for manufacturing an insulated gate switching device. The method comprises: forming a first trench in a surface of a first SiC semiconductor layer being of n-type; implanting p-type impurities into a bottom surface of the first trench; depositing a second SiC semiconductor layer being of n-type on an inner surface of the first trench after implanting the p-type impurities so as to form a second trench above an implanted region of the p-type impurities, the second trench having a width narrower than a width of the first trench; and forming a gate insulating layer, a gate electrode, a first region and a body region so that the gate insulating layer covers an inner surface of the second trench, the gate electrode is located in the second trench, the first region is of n-type and in contact with the gate insulating layer, the body region is of p-type, separated from the implanted region, and in contact with the gate insulating layer under the first region.

Notably, in the formation of the second trench, the first trench may be filled with the second SiC semiconductor layer, and then the second SiC semiconductor layer may be etched so as to form the second trench. Moreover, in the formation of the second trench, the second trench may be formed by depositing the second SiC semiconductor layer on a lateral surface of the first trench so as to narrow the width of the first trench. Moreover, an order of formation of the gate insulating layer, the gate electrode, the first region, and the body region is not limited. The first region and the body region may be formed before the formation of the gate insulating layer and the gate electrode (e.g., before the formation of the second trench), or the first region and the body region may be formed after the formation of the gate insulating layer and the gate electrode. Moreover, the insulated gate switching devices are classified into a unipolar-type switching device (e.g., a MOSFET) and a bipolar-type switching device (e.g., an IGBT). The first region serves as a source region in the unipolar-type switching device, whereas the first region serves as an emitter region in the bipolar-type switching device.

In this manufacturing method, initially, the first trench is formed in the surface of the first SiC semiconductor layer, and p-type impurities are implanted into the bottom surface of the first trench. In the implanted region of the p-type impurities, the electric field relaxation region of p-type is formed. Accordingly, a width of the implanted region of the p-type impurities (i.e., the electric field relaxation region) is equal to or slightly wider than the width of the first trench. After the p-type impurities are implanted, the second SiC semiconductor layer is deposited on the inner surface of the first trench. The second trench having a width narrower than the width of the first trench is thereby formed above the implanted region of the p-type impurities. Since the width of the second trench is narrower than the width of the first trench, the width of the second trench is narrower than the width of the implanted region of the p-type impurities. Accordingly, there can be obtained a structure in which the implanted region of the p-type impurities significantly protrudes in the lateral direction with respect to a lateral surface of the second trench. Afterwards, when the gate insulating layer and the gate electrode are formed in the second trench, there can be obtained a structure in which the implanted region of the p-type impurities significantly protrudes in the lateral direction with respect to the gate insulating layer at the lateral surface of the second trench. As such, according to this manufacturing method, a protruding amount of the implanted region of the p-type impurities (i.e., the electric field relaxation region) can be increased. Accordingly, the electric field applied to the gate insulating layer can more effectively be relaxed.

Moreover, the present disclosure provides a novel insulated gate switching device. A first insulated gate switching device disclosed in the present specification comprises a SiC semiconductor substrate having a surface in which a trench is provided, a gate insulating layer covering an inner surface of the trench; and a gate electrode located in the trench. The SiC semiconductor substrate has a first region, a body region, a second region, and an electric field relaxation region. The first region is of n-type and in contact with the gate insulating layer. The body region is of p-type and in contact with the gate insulating layer under the first region. The second region is of n-type, in contact with the gate insulating layer under the body region, and separated from the first region by the body region. The electric field relaxation region is of p-type, located below the trench, separated from the body region by the second region, and having a width wider than a width of the trench. The body region has a first portion adjacent to the gate insulating layer and a second portion adjacent to the first portion on an opposite side from the gate insulating layer. A density of n-type impurities in the first portion is higher than a density of n-type impurities in the second portion. A lower end of the first portion is located on an upper side with respect to a lower end of the second portion.

Notably, the body region (i.e., the first portion and the second portion) contains both of p-type impurities and n-type impurities, and is of p-type because the density of p-type impurities is higher than the density of n-type impurities. If the density of p-type impurities is distributed similarly in the first portion and the second portion, the lower end of the first portion having a high density of n-type impurities is located on an upper side with respect to the lower end of the second portion having a low density of n-type impurities.

In this insulated gate switching device, the width of the electric field relaxation region is wider than the width of the trench, and hence the electric field relaxation region protrudes in the lateral direction from the gate insulating layer at the lateral surface of the trench. Accordingly, a high electric field is difficult to be applied to the gate insulating layer. Moreover, in this insulated gate switching device, the lower end of the first portion of the body region is located on the upper side with respect to the lower end of the second portion. The lower end of the first portion, which is a portion in contact with the gate insulating layer, is located on the upper side, and hence a channel length becomes short. Accordingly, this insulated gate switching device has a small channel resistance. Moreover, the lower end of the second portion is located on the lower side, and hence a depletion layer that extends from the second region to the body region when the insulated gate switching device is turned off is difficult to extend to an upper end of the body region. In other words, it is difficult to occur a state in which a depletion layer penetrates the body region (the so-called punch-through).

Notably, the relation of the densities of n-type impurities in the first portion and in the second portion may be reversed. In other words, in the second insulated gate switching device disclosed in the present specification, the density of n-type impurities in the first portion of the body region is lower than the density of n-type impurities in the second portion of the body region. The lower end of the first portion is located on a lower side with respect to the lower end of the second portion.

In this insulated gate switching device, the width of the electric field relaxation region is wider than the width of the trench, and hence the electric field relaxation region protrudes in the lateral direction from the gate insulating layer at the lateral surface of the trench. Accordingly, a high electric field is difficult to be applied to the gate insulating layer. Moreover, in this insulated gate switching device, the lower end of the first portion of the body region is located on the lower side with respect to the lower end of the second portion. Accordingly, a region where the second region and the gate insulating layer are in contact with each other is small. The electric field applied to the gate insulating layer can thereby be suppressed more effectively.

BRIEF DESCRIPTION OF DRAWINGS

FIG. 26 is an illustrative diagram of the manufacturing method of the third variation.

DESCRIPTION OF EMBODIMENTS

Embodiment 1

Figure 1:
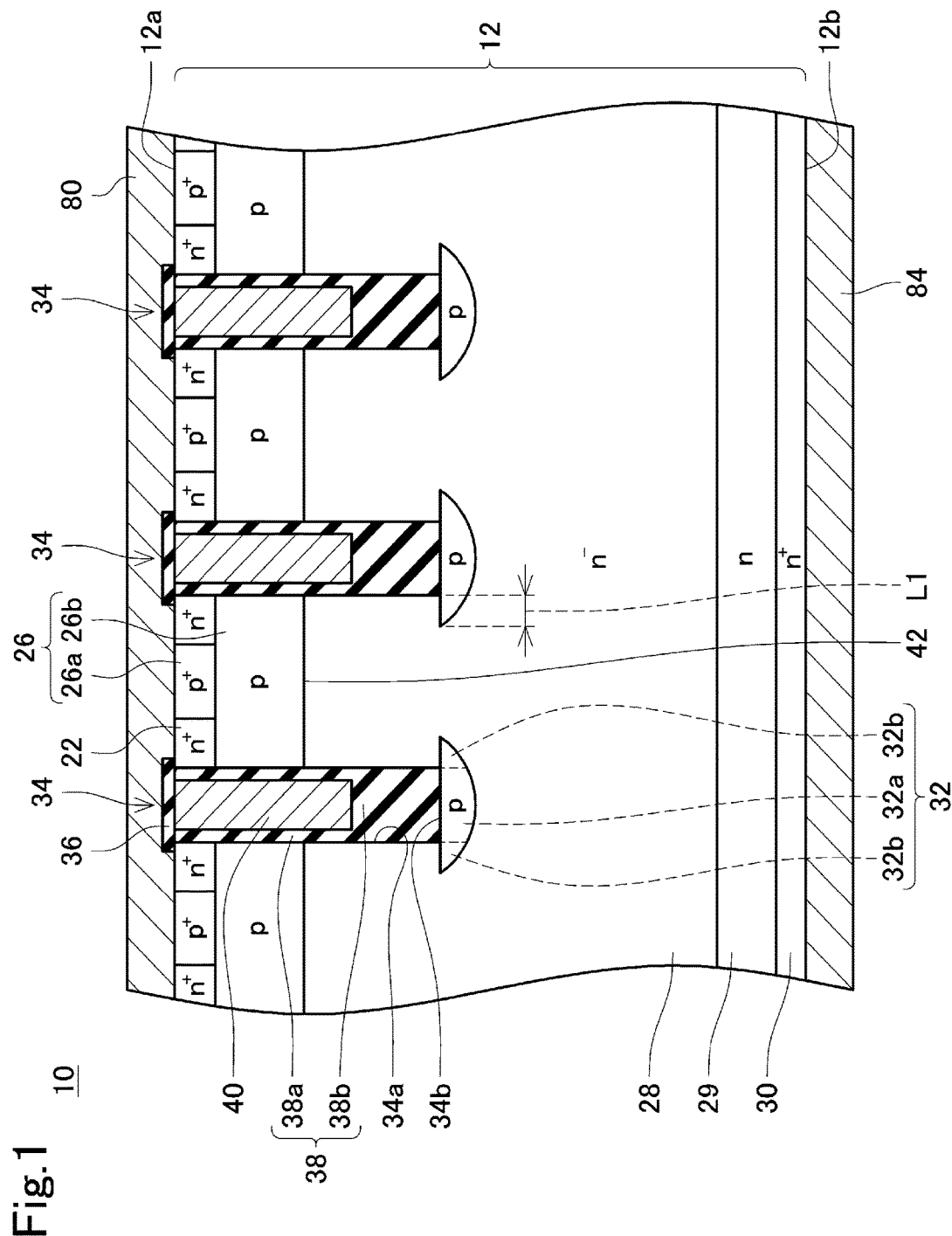
FIG. 1 is a longitudinal cross-sectional view of a MOSFET 10 in Embodiment 1.

A MOSFET 10 in Embodiment 1 shown in FIG. 1 has a SiC semiconductor substrate 12. A source electrode 80 is formed on a front surface 12a of the SiC semiconductor substrate 12. A drain electrode 84 is formed on a rear surface 12b of the SiC semiconductor substrate 12.

A plurality of gate trenches 34 is formed in the front surface 12a of the SiC semiconductor substrate 12. Each of the gate trenches 34 extends long in a direction vertical to a paper surface of FIG. 1. A gate insulating layer 38 and a gate electrode 40 are formed in each gate trench 34. The gate insulating layer 38 includes a bottom insulating layer 38b and a lateral insulating film 38a. The bottom insulating layer 38b is a thick insulating layer formed at a bottom of the gate trench 34. A portion of a lateral surface 34a of the gate trench 34 located on an upper side with respect to the bottom insulating layer 38b is covered with the lateral insulating film 38a. The lateral insulating film 38a is linked to the bottom insulating layer 38b. The gate electrode 40 is located in the gate trench 34 on an upper side of the bottom insulating layer 38b. The gate electrode 40 is insulated from the SiC semiconductor substrate 12 by the lateral insulating film 38a and the bottom insulating layer 38b. An upper surface of the gate electrode 40 is covered with an interlayer insulating layer 36. The gate electrode 40 is insulated from the source electrode 80 by the interlayer insulating layer 36.

In the SiC semiconductor substrate 12, source regions 22, body regions 26, a drift region 28, a buffer region 29, a drain region 30, and electric field relaxation regions 32 are formed.

A plurality of the source regions 22 is formed in the SiC semiconductor substrate 12. Each of the source regions 22 is a region of n-type. The source region 22 is formed in a range exposed on the front surface 12a of the SiC semiconductor substrate 12. The source region 22 is in ohmic contact with the source electrode 80. The source region 22 is in contact with the lateral insulating film 38a.

The body regions 26 are formed laterally to and under the source regions 22, and in contact with the source regions 22. Each of the body regions 26 is a region of p-type, and includes a contact region 26a and a low-density body region 26b. A density of p-type impurities in the contact region 26a is higher than a density of p-type impurities in the low-density body region 26b. The contact region 26a is formed laterally to the source region 22, and exposed to the front surface 12a of the SiC semiconductor substrate 12. The contact region 26a is in ohmic contact with the source electrode 80. The low-density body region 26b is formed under the source region 22 and the contact region 26a. The low-density body region 26b is in contact with the lateral insulating film 38a under the source region 22.

The drift region 28 is a region of n-type, and contains n-type impurities in a low density. The density of n-type impurities in the drift region 28 is lower than the density of n-type impurities in the source region 22. The drift region 28 is formed under the low-density body region 26b. The drift region 28 spreads from a position of a lower end of the low-density body region 26b to a lower side with respect to a bottom surface 34b of the gate trench 34. The drift region 28 is separated from the source region 22 by the body region 26. The drift region 28 is in contact with the lateral insulating film 38a and the bottom insulating layer 38b under the low-density body region 26b.

The source region 22, the low-density body region 26b, and the drift region 28 described above face the gate electrode 40 via the lateral insulating film 38a.

The electric field relaxation regions 32 are regions of p-type. Each of the electric field relaxation regions 32 is formed at a position exposed to a bottom surface 34b of corresponding gate trench 34. The electric field relaxation region 32 is in contact with the bottom insulating layer 38b in the entire region of the bottom surface 34b. A periphery of the electric field relaxation region 32 is surrounded by the drift region 28. The electric field relaxation regions 32 are separated from each other by the drift region 28. The electric field relaxation region 32 is separated from the body region 26 by the drift region 28. The electric field relaxation region 32 is not connected to any of the electrodes. Accordingly, a potential of the electric field relaxation region 32 is kept at a floating potential. A width of the electric field relaxation region 32 is wider than a width of the gate trench 34. Notably, the width of the gate trench 34 means a dimension of the gate trench 34 in a short-side direction when the front surface 12a of the SiC semiconductor substrate 12 is seen in a plan view. Moreover, the width of the electric field relaxation region 32 means a dimension of the electric field relaxation region 32 in the same direction as the direction in which the width of the gate trench 34 is measured. The width of the electric field relaxation region 32 is wider than the width of the gate trench 34, and hence the electric field relaxation region 32 has a main part 32a located immediately below the gate trench 34, and a protruding part 32b that protrudes in a lateral direction from the main part 32a with respect to the lateral surface 34a of the gate trench 34 (i.e., the lateral insulating film 38a). The protruding part 32b is located immediately below the low-density body region 26b.

The buffer region 29 is a region of n-type, and contains n-type impurities in a density higher than the density in the drift region 28. The buffer region 29 is formed under the drift region 28, and in contact with the drift region 28.

The drain region 30 is a region of n-type, and contains n-type impurities in a density higher than the density in the buffer region 29. The drain region 30 is formed under the buffer region 29, and in contact with the buffer region 29. The drain region 30 is formed in a range exposed to the rear surface 12b of the SiC semiconductor substrate 12. The drain region 30 is in ohmic contact with the drain electrode 84.

Next, an operation of the MOSFET 10 will be described. A potential higher than the potential of the source electrode 80 is applied to the drain electrode 84. Moreover, when a potential equal to or higher than a threshold value is applied to the gate electrode 40, a range of the low-density body region 26b adjacent to the lateral insulating film 38a is reversed to n-type, and a channel is formed therein. Consequently, electrons flow from the source electrode 80 toward the drain electrode 84 through the source region 22, the channel, the drift region 28, the buffer region 29, and the drain region 30. In other words, the MOSFET 10 is turned on.

When the potential of the gate electrode 40 is lowered to a potential lower than the threshold value, the channel disappears, and the MOSFET 10 is turned off. Consequently, a depletion layer spreads from a pn junction 42, which is a boundary part between the body region 26 and the drift region 28, into the body region 26 and into the drift region 28. The depletion layer extending from the pn junction 42 into the drift region 28 reaches the electric field relaxation region 32. Consequently, the depletion layer spreads from the electric field relaxation region 32 into the drift region 28 on the periphery of the electric field relaxation region 32. In other words, the electric field relaxation region 32 promotes extension of the depletion layer into the drift region 28. The electric field relaxation region 32 promotes extension of the depletion layer to the proximity of the gate trench 34, and hence application of a high electric field to the gate insulating layer 38 is suppressed. In particular, the electric field relaxation region 32 has the protruding part 32b, and hence a potential difference is difficult to be generated in a portion of the drift region 28 sandwiched between the protruding part 32b and the body region 26, and the electric field applied to the gate insulating layer 38 is thereby suppressed effectively. As a protruding amount L1 of the protruding part 32b becomes larger, the electric field is more difficult to be applied to the gate insulating layer 38. In the present embodiment, the protruding part 32b has the protruding amount L1 larger than that of the conventional electric field relaxation region, and hence the electric field applied to the gate insulating layer 38 can be made extremely small. Accordingly, in this MOSFET 10, a current that flows by penetrating the gate insulating layers 38 can be suppressed.

Figure 2:
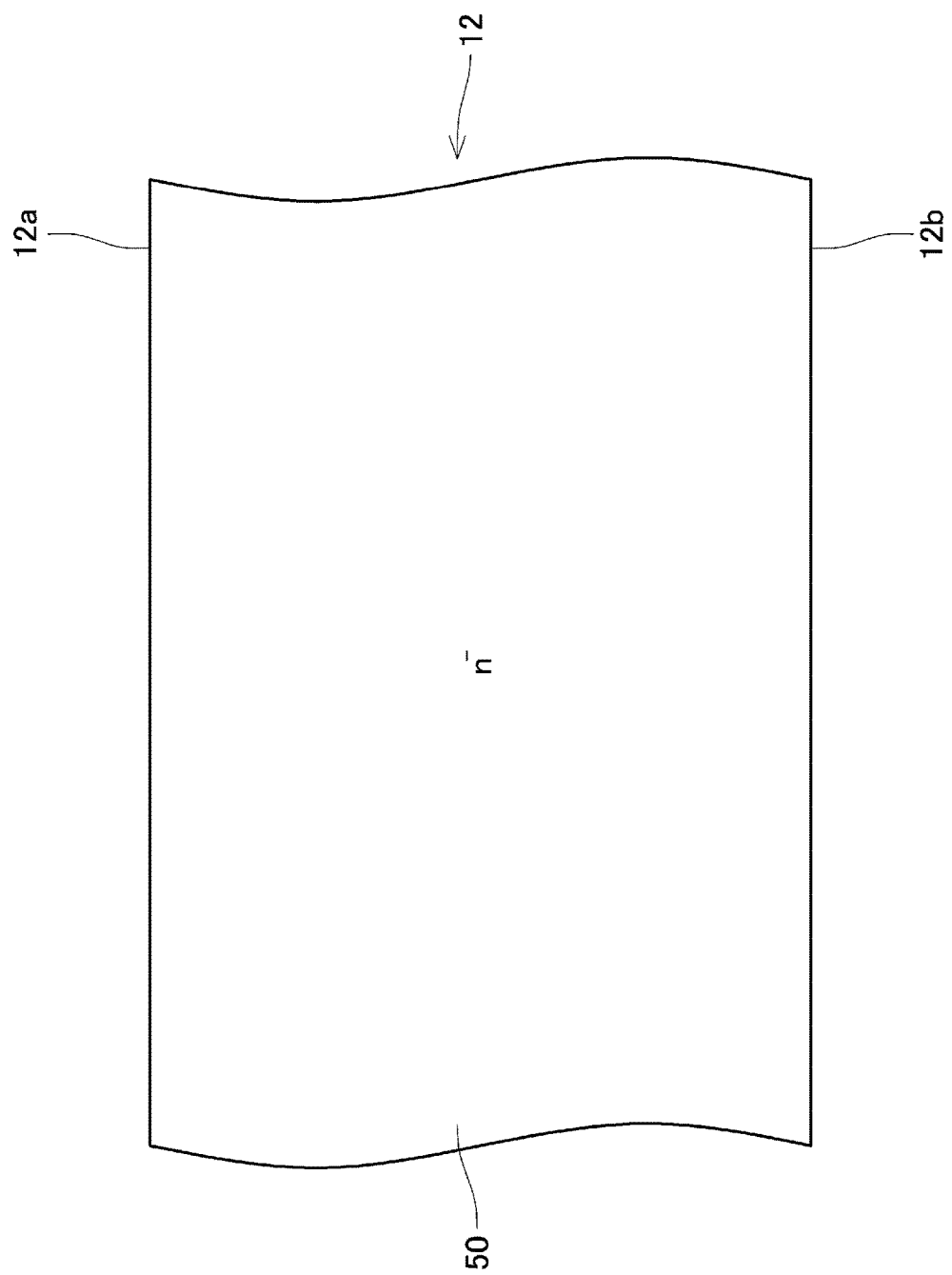
FIG. 2 is an illustrative diagram of a method for manufacturing the MOSFET 10 in Embodiment 1.

Next, a method for manufacturing the MOSFET 10 will be described. The MOSFET 10 is manufactured from the SiC semiconductor substrate 12 shown in FIG. 2. The SiC semiconductor substrate 12 before processing is configured with a first SiC semiconductor layer 50, entire of which is SiC of n-type. Notably, the first SiC semiconductor layer 50 may be a bulk crystal or an epitaxial layer. The density of n-type impurities in the first SiC semiconductor layer 50 is approximately equal to the density of n-type impurities in the drift region 28.

(Wide-Width Trench Forming Step)

Figure 3:
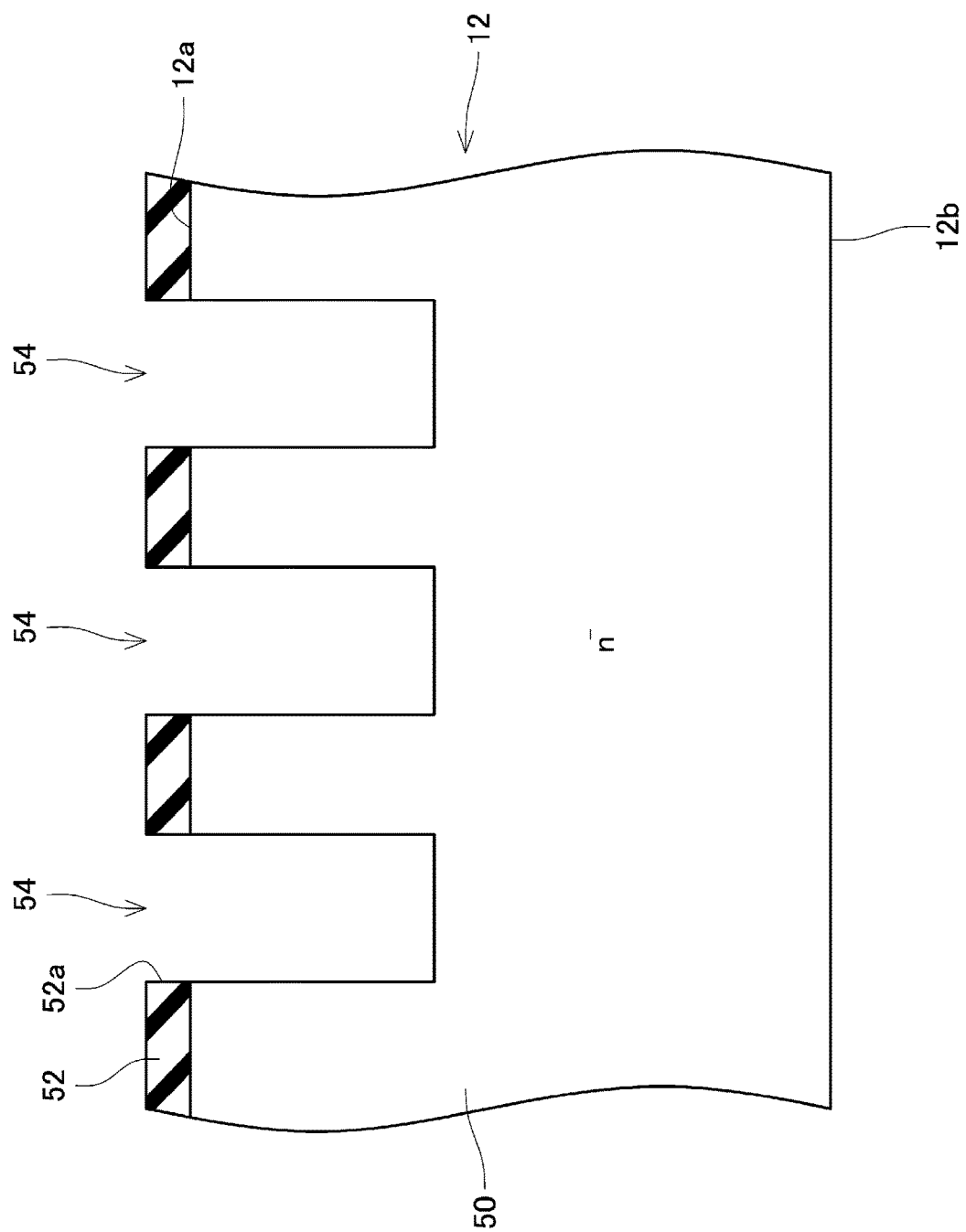
FIG. 3 is an illustrative diagram of the method for manufacturing the MOSFET 10 in Embodiment 1.

Initially, as shown in FIG. 3, an etching mask 52 that has a plurality of openings 52a is formed on the front surface 12a of the SiC semiconductor substrate 12. Next, a portion of the first SiC semiconductor layer 50 located in each of the openings 52a is dry etched. A plurality of wide-width trenches 54 is thereby formed in the front surface 12a of the first SiC semiconductor layer 50. The wide-width trenches 54 are formed with a pattern corresponding to the above-described gate trenches 34. However, the width of each of the wide-width trenches 54 is wider than the width of the gate trench 34. The etching mask 52 is removed after the formation of the wide-width trenches 54.

(Bottom Surface Ion Implanting Step)

Figure 4:
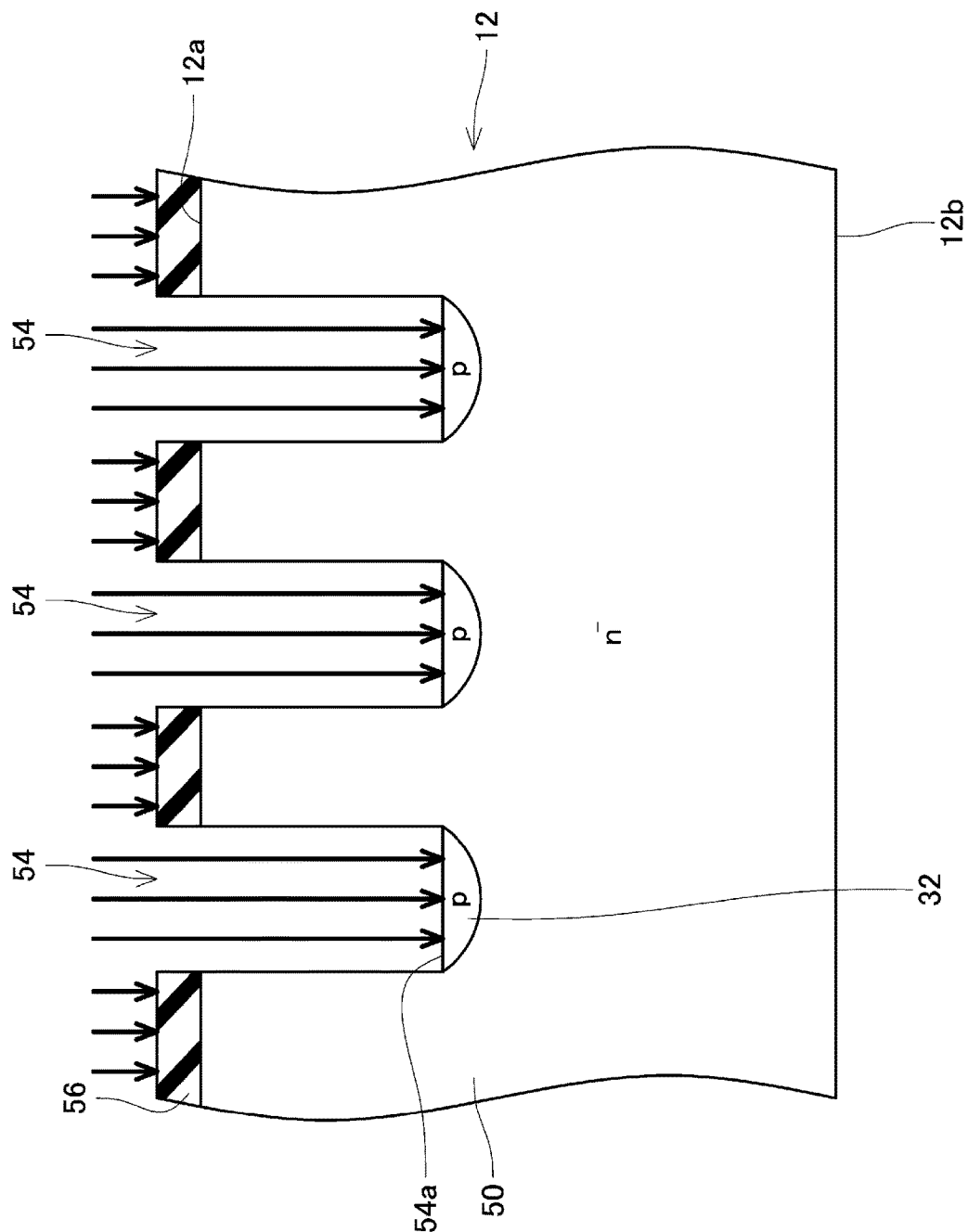
FIG. 4 is an illustrative diagram of the method for manufacturing the MOSFET 10 in Embodiment 1.

Next, as shown in FIG. 4, an ion implanting mask 56 is formed on the front surface 12a of the first SiC semiconductor layer 50. The ion implanting mask 56 is not formed in each wide-width trench 54. Next, ionized p-type impurities (aluminum in the present embodiment) are implanted into the first SiC semiconductor layer 50 from the front surface 12a side (i.e., the ion implanting mask 56 side) of the first SiC semiconductor layer 50. The front surface 12a of the first SiC semiconductor layer 50 is covered with the ion implanting mask 56, and hence the p-type impurities are implanted into a bottom surface 54a of the wide-width trench 54. After the p-type impurities are implanted into the bottom surface 54a, the SiC semiconductor substrate 12 is thermally treated. The p-type impurities implanted into the bottom surface 54a are thereby activated, and a range of the semiconductor region exposed on the bottom surface 54a becomes p-type. The electric field relaxation regions 32 are thereby formed. Notably, when the SiC semiconductor substrate is thermally treated, the p-type impurities are difficult to be diffused. Accordingly, the width of the electric field relaxation region 32 is approximately equal to the width of the wide-width trench 54.

(Epitaxially-Growing Step)

Figure 5:
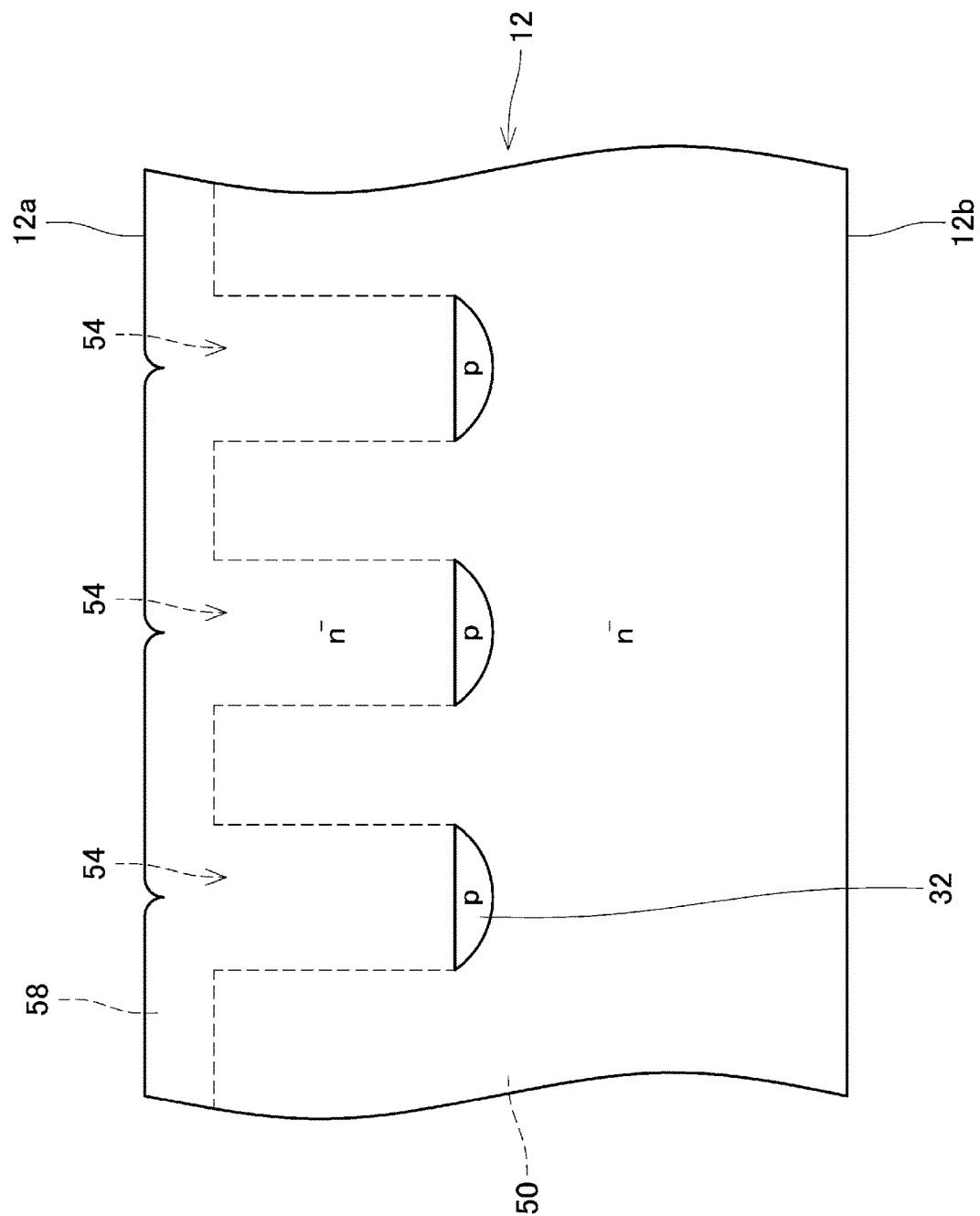
FIG. 5 is an illustrative diagram of the method for manufacturing the MOSFET 10 in Embodiment 1.
Figure 6:
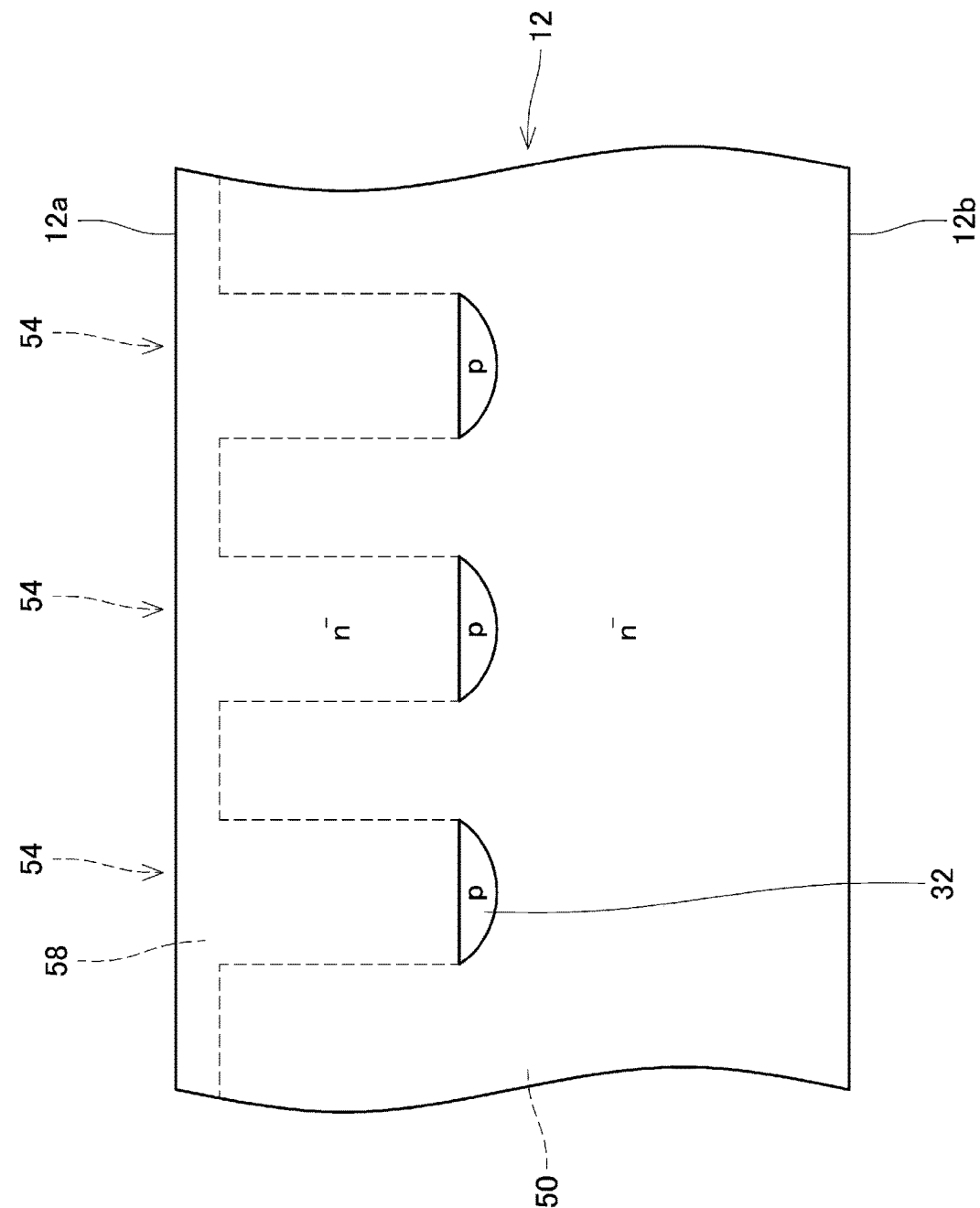
FIG. 6 is an illustrative diagram of the method for manufacturing the MOSFET 10 in Embodiment 1.

Next, as shown in FIG. 5, a second SiC semiconductor layer 58, which is SiC of n-type, is epitaxially grown on the front surface 12a of the SiC semiconductor substrate 12 and on an inner surface of the wide-width trench 54. Here, the second SiC semiconductor layer 58 is grown until no cavity is left in the wide-width trench 54. The density of n-type impurities in the second SiC semiconductor layer 58 is approximately equal to the density of n-type impurities in the first SiC semiconductor layer 50. Accordingly, the second SiC semiconductor layer 58 and the first SiC semiconductor layer 50 becomes an integrated semiconductor region of n-type. As shown in FIG. 6, when the second SiC semiconductor layer 58 is formed, a front surface of the second SiC semiconductor layer 58 (i.e., the front surface 12a of the SiC semiconductor substrate 12) is etched for planarization.

(Gate Trench Forming Step)

Figure 7:
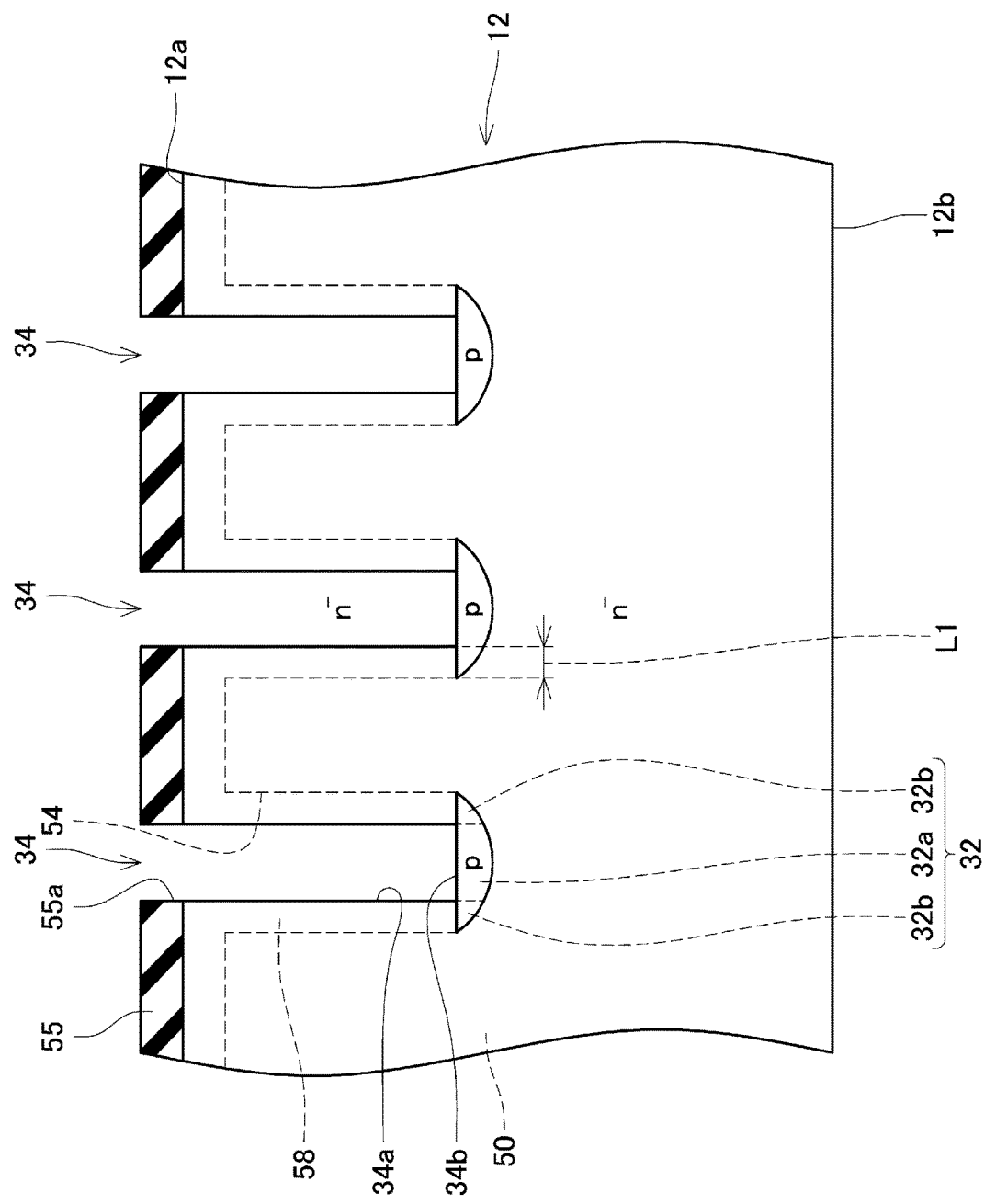
FIG. 7 is an illustrative diagram of the method for manufacturing the MOSFET 10 in Embodiment 1.

Next, as shown in FIG. 7, an etching mask 55 that has a plurality of openings 55a is formed on the front surface 12a of the SiC semiconductor substrate 12. The openings 55a are located on the second SiC semiconductor layer 58 formed in the wide-width trenches 54, respectively. The width of each of the openings 55a is narrower than the width of each of the wide-width trenches 54. Moreover, the opening 55a is located at a central part of the wide-width trench 54 in its width direction. Next, a portion of the second SiC semiconductor layer 58 located in the opening 55a is dry etched. The gate trench 34 is thereby formed immediately above the electric field relaxation region 32. More specifically, the gate trench 34 is formed immediately above a central part of the electric field relaxation region 32. Moreover, the gate trench 34 is formed to reach the electric field relaxation region 32. Moreover, a width of the gate trench 34 becomes narrower than the width of the wide-width trench 54. In other words, the width of the gate trench 34 becomes narrower than the width of the electric field relaxation region 32. The electric field relaxation region 32 resultantly has the main part 32a located immediately below the gate trench 34, and the protruding part 32b that protrudes in the lateral direction from the main part 32a with respect to the lateral surface 34a of the gate trench 34. The protruding parts 32b are formed on both sides of the main part 32a, respectively. The protruding amount L1 of each of the protruding parts 32b is determined by a difference between the width of the wide-width trench 54 and the width of the gate trench 34. Therefore, according to this method, even in a case of using the SiC semiconductor substrate 12 having a small diffusion coefficient of p-type impurities, the electric field relaxation region 32 having the large protruding amount L1 can be formed.

(Gate Insulating Layer Forming Step and Gate Electrode Forming Step)

Figure 8:
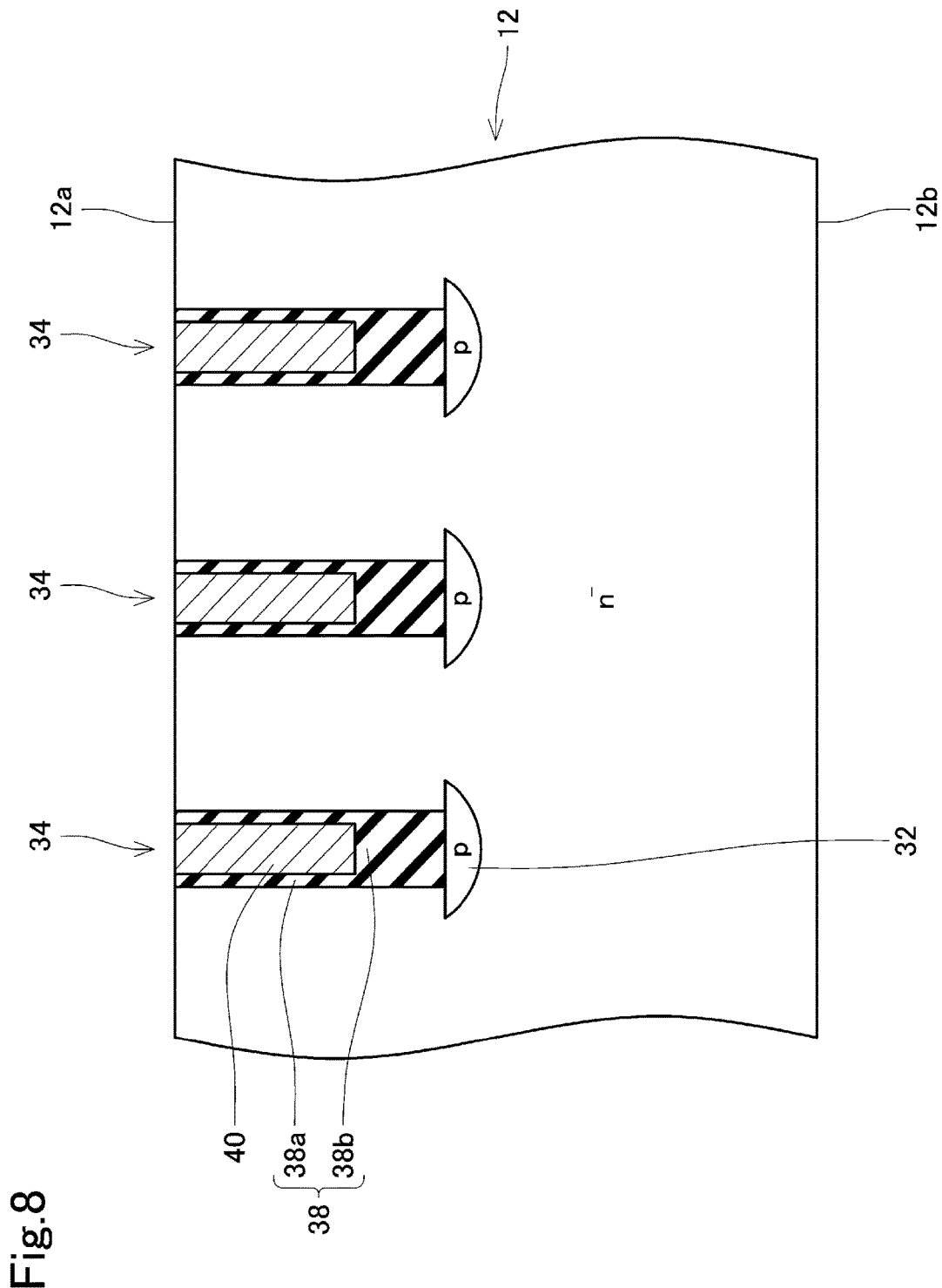
FIG. 8 is an illustrative diagram of the method for manufacturing the MOSFET 10 in Embodiment 1.

Next, as shown in FIG. 8, the gate insulating layer 38 and the gate electrode 40 are formed in the gate trench 34. Notably, as described above, the first SiC semiconductor layer 50 and the second SiC semiconductor layer 58 have been integrated, and hence FIG. 8, and FIGS. 9 and 10, which will be described later, do not show a boundary between the first SiC semiconductor layer 50 and the second SiC semiconductor layer 58. In this step, an insulating layer is initially grown in the gate trench 34 so as not to leave a cavity. Next, the insulating layer thus grown is etched so as to allow the insulating layer to remain exclusively in the proximity of the bottom of the gate trench 34. The insulating layer thus remaining becomes the bottom insulating layer 38b. Next, a thin insulating film is grown in the lateral surface 34a of the gate trench 34 on an upper side with respect to the bottom insulating layer 38b, so as to form the lateral insulating film 38a. The gate insulating layer 38 is thereby completed. When the gate insulating layer 38 is formed, the gate electrode 40 (i.e., polysilicon) is grown in the gate trench 34 so as not to leave a cavity.

(Body Region and Source Region Forming Step)

Figure 9:
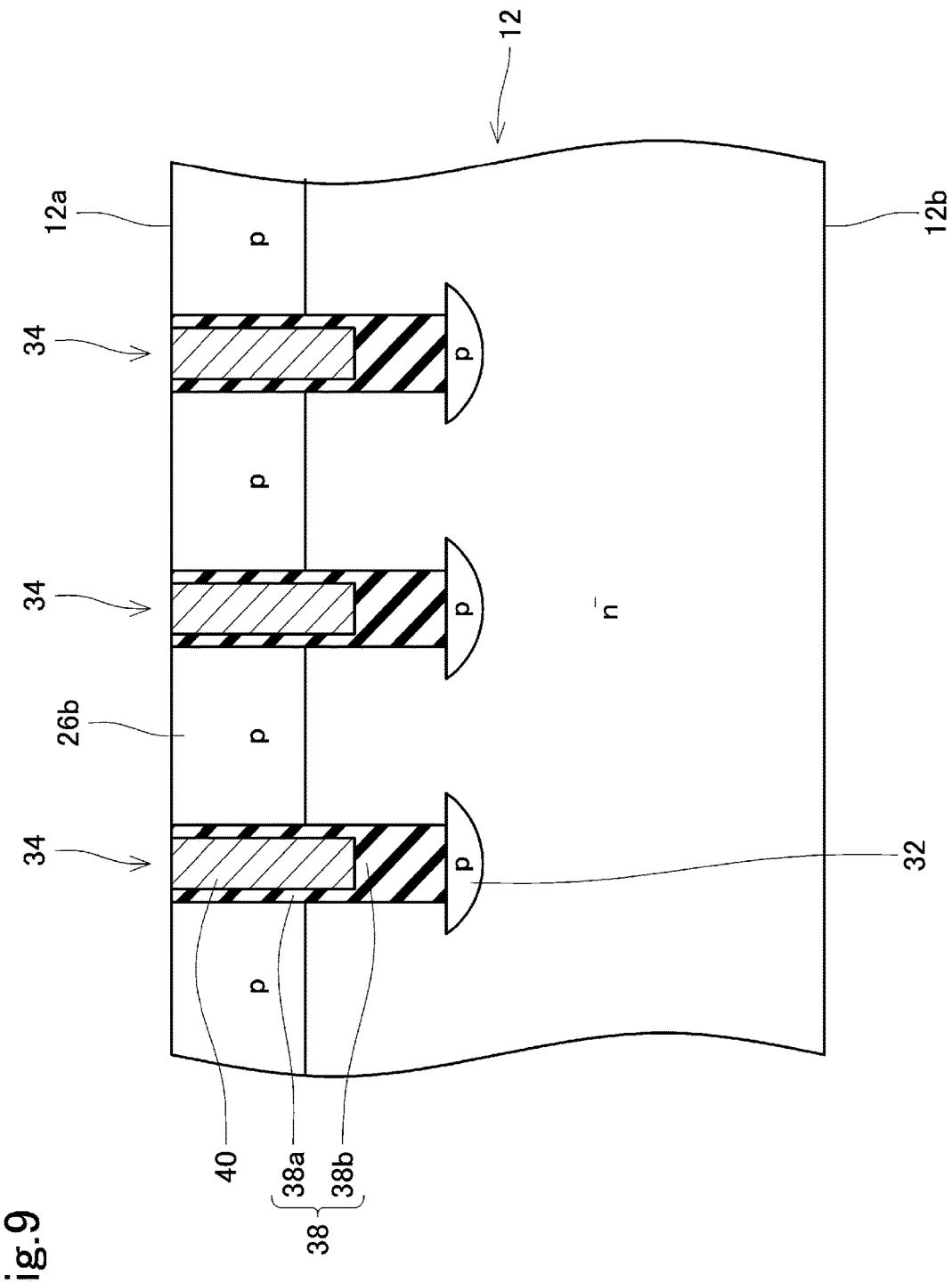
FIG. 9 is an illustrative diagram of the method for manufacturing the MOSFET 10 in Embodiment 1.
Figure 10:
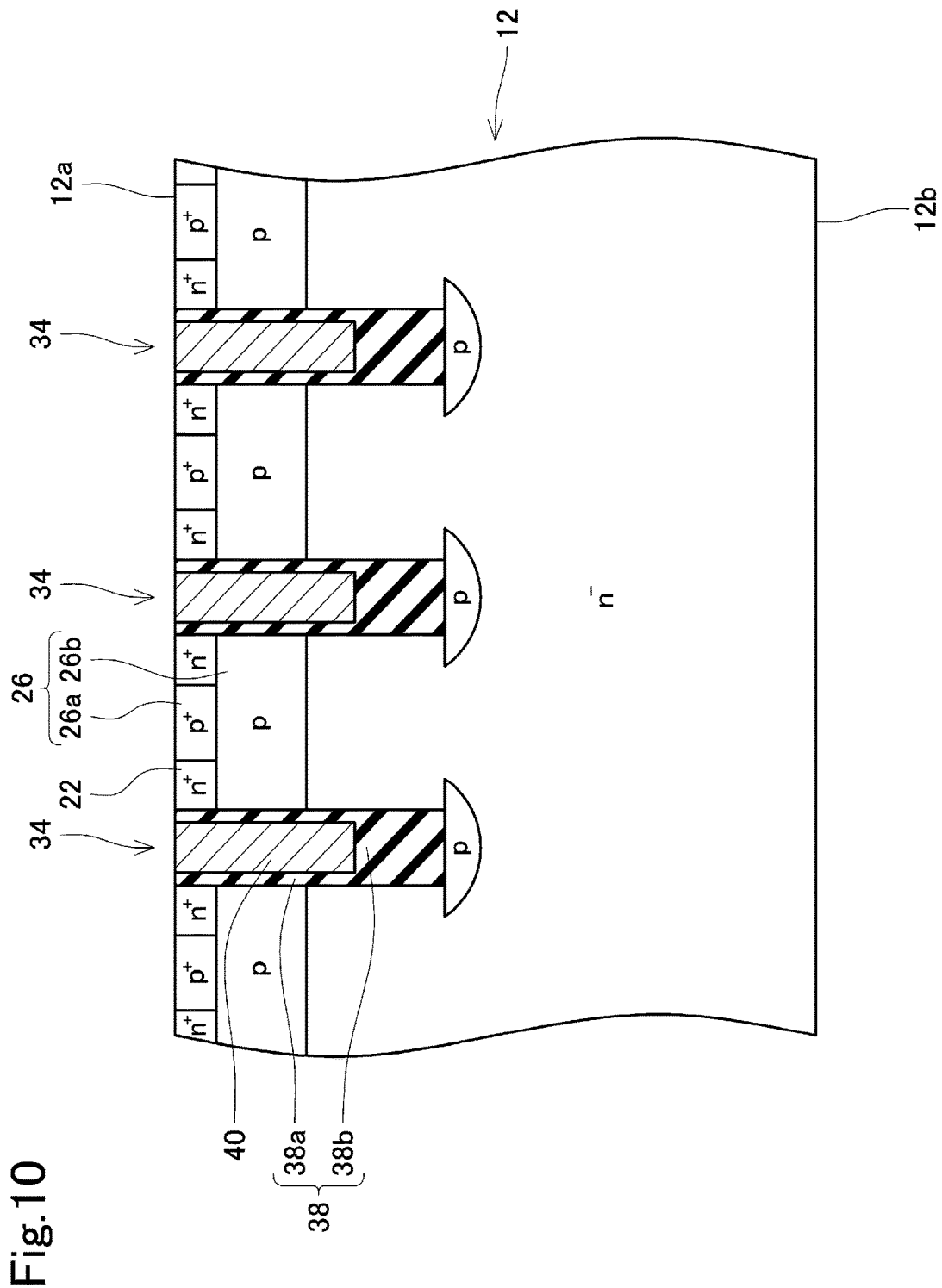
FIG. 10 is an illustrative diagram of the method for manufacturing the MOSFET 10 in Embodiment 1.

Next, as shown in FIG. 9, p-type impurities are implanted into the SiC semiconductor substrate 12 from the front surface 12a side, so as to form the low-density body region 26b. Next, as shown in FIG. 10, n-type impurities and p-type impurities are selectively implanted from the front surface 12a side, so as to form the source regions 22 and the contact regions 26a. After impurities are implanted into these regions, the SiC semiconductor substrate 12 is thermally treated to activate the impurities thus implanted.

Afterwards, other structures on the front surface 12a side of the MOSFET 10 (i.e., the interlayer insulating layer 36, the source electrode 80, and the like) are formed. Next, the structures on the rear surface 12b side of the MOSFET 10 (i.e., the buffer region 29, the drain region 30, the drain electrode 84, and the like) are formed. By executing the above-described steps, the MOSFET 10 shown in FIG. 1 is completed.

As described above, according to this method, the MOSFET 10 that allows the electric field relaxation region 32 to have the large protruding amount L1 can be manufactured. In other words, the MOSFET 10 in which an electric field is hardly applied to the gate insulating layer 38 can be manufactured.

Moreover, in the above-described epitaxially-growing step, if the second SiC semiconductor layer 58 that has a crystallinity higher than the crystallinity of the first SiC semiconductor layer 50 (i.e., that has less crystal defects) is formed, the crystallinity of a region of the MOSFET 10 where a channel is formed (i.e., a range of the low-density body region 26b adjacent to the gate insulating layer 38) can be improved. The channel resistance can thereby be reduced, and the on-resistance of the MOSFET 10 can thereby be reduced. By adjusting the crystal growth condition of the second SiC semiconductor layer 58, crystal defects of the second SiC semiconductor layer 58 can be reduced.

Embodiment 2

Figure 11:
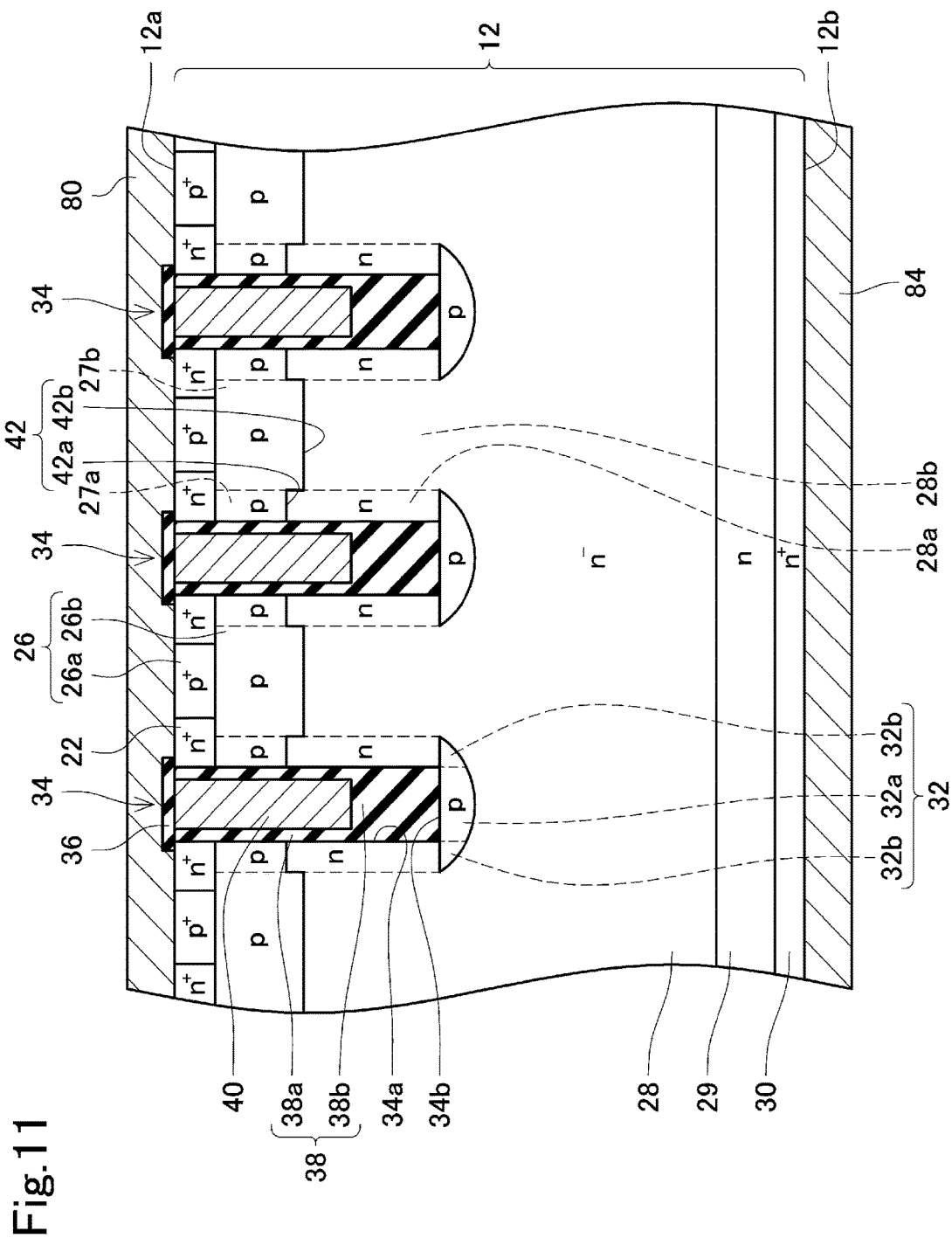
FIG. 11 is a longitudinal cross-sectional view of a MOSFET in Embodiment 2.

In a MOSFET in Embodiment 2 shown in FIG. 11, a density of n-type impurities in a gate adjacent portion 27a of the low-density body region 26b that is in contact with the gate insulating layer 38 is higher than a density of n-type impurities in a gate non-adjacent portion 27b that is apart from the gate insulating layer 38. Notably, the gate non-adjacent portion 27b is adjacent to the gate adjacent portion 27a on an opposite side from the gate insulating layer 38. A lower end of the gate adjacent portion 27a (i.e., a pn junction 42a at a boundary between the gate adjacent portion 27a and the drift region 28) is located on an upper side with respect to a lower end of the gate non-adjacent portion 27b (i.e., a pn junction 42b at a boundary between the gate non-adjacent portion 27b and the drift region 28). Moreover, a density of n-type impurities in a portion 28a of the drift region 28 that is in contact with the gate insulating layer 38 is higher than a density of n-type impurities in a portion 28b that is in contact with the portion 28a on an opposite side from the gate insulating layer 38. The gate adjacent portion 27a and the portion 28a of the drift region 28 are located immediately above the electric field relaxation region 32 (more specifically, the protruding part 32b). Other configurations in the MOSFET in Embodiment 2 are the same as those in the MOSFET 10 in Embodiment 1.

When the MOSFET is turned on, a channel is formed in the low-density body region 26b at a position in contact with the gate insulating layer 38. In other words, in the MOSFET in Embodiment 2, a channel is formed in the gate adjacent portion 27a. As described above, in the MOSFET in Embodiment 2, the lower end of the gate adjacent portion 27a is located on the upper side with respect to the lower end of the gate non-adjacent portion 27b. Accordingly, the MOSFET in Embodiment 2 has a short channel length. As such, the MOSFET in Embodiment 2 has a short channel length, and hence has a small channel resistance. Accordingly, the MOSFET in Embodiment 2 has a small on-resistance.

Moreover, in a normally-used state, a depletion layer that extends from the pn junction 42 into the body region 26 while the MOSFET is turned off does not reach the source region 22. However, there may be a case where the potential of the drain electrode 84 becomes extremely high depending on an operation state of a circuit to which the MOSFET 10 is connected. As such, when an extremely high potential is applied to the drain electrode 84, there may be a case where the depletion layer that extends from the pn junction 42 into the body region 26 reaches the source region 22. In other words, a punch-through occurs. In the MOSFET 10 in Embodiment 2, the lower end of the gate non-adjacent portion 27b is located on the lower side with respect to the lower end of the gate adjacent portion 27a, and hence a long distance is ensured from the lower end of the gate non-adjacent portion 27b to the source region 22. Accordingly, a punch-through is difficult to occur, and the MOSFET in Embodiment 2 has a high punch-through voltage.

As such, by locating the lower end of the gate adjacent portion 27a on the upper side with respect to the lower end of the gate non-adjacent portion 27b, a low channel resistance and a high punch-through voltage can be realized.

Figure 12:
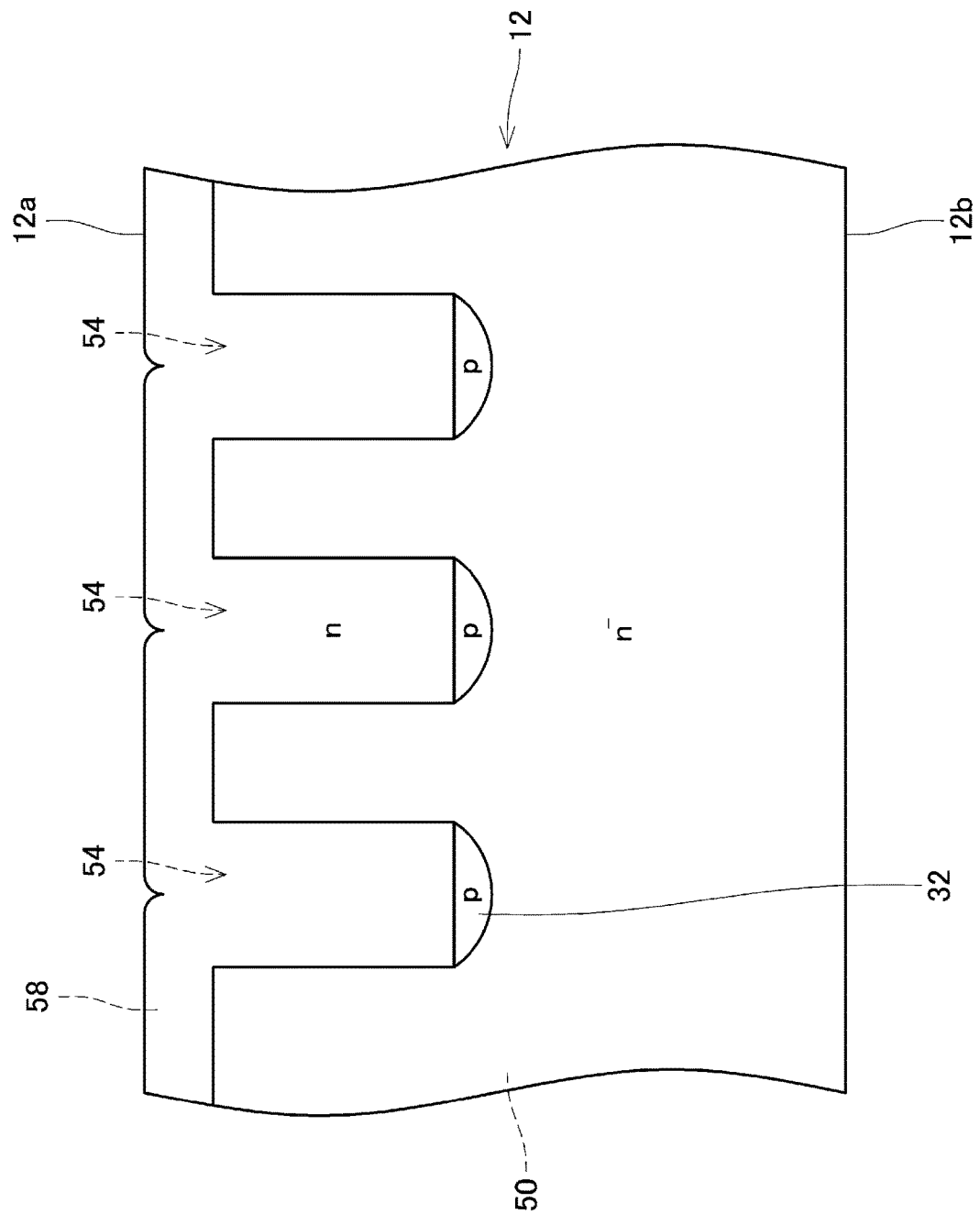
FIG. 12 is an illustrative diagram of a method for manufacturing the MOSFET in Embodiment 2.
Figure 13:
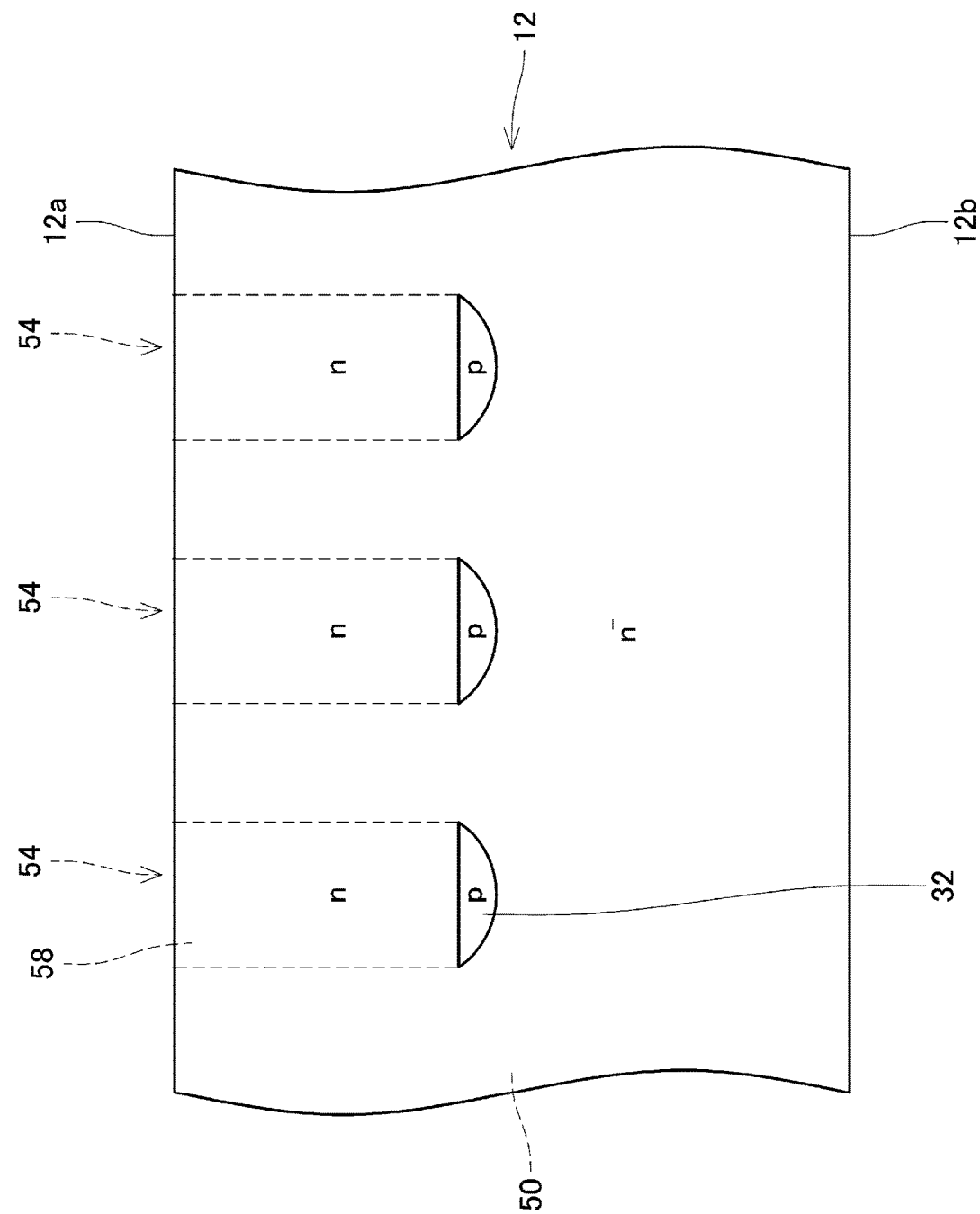
FIG. 13 is an illustrative diagram of the method for manufacturing the MOSFET in Embodiment 2.
Figure 14:
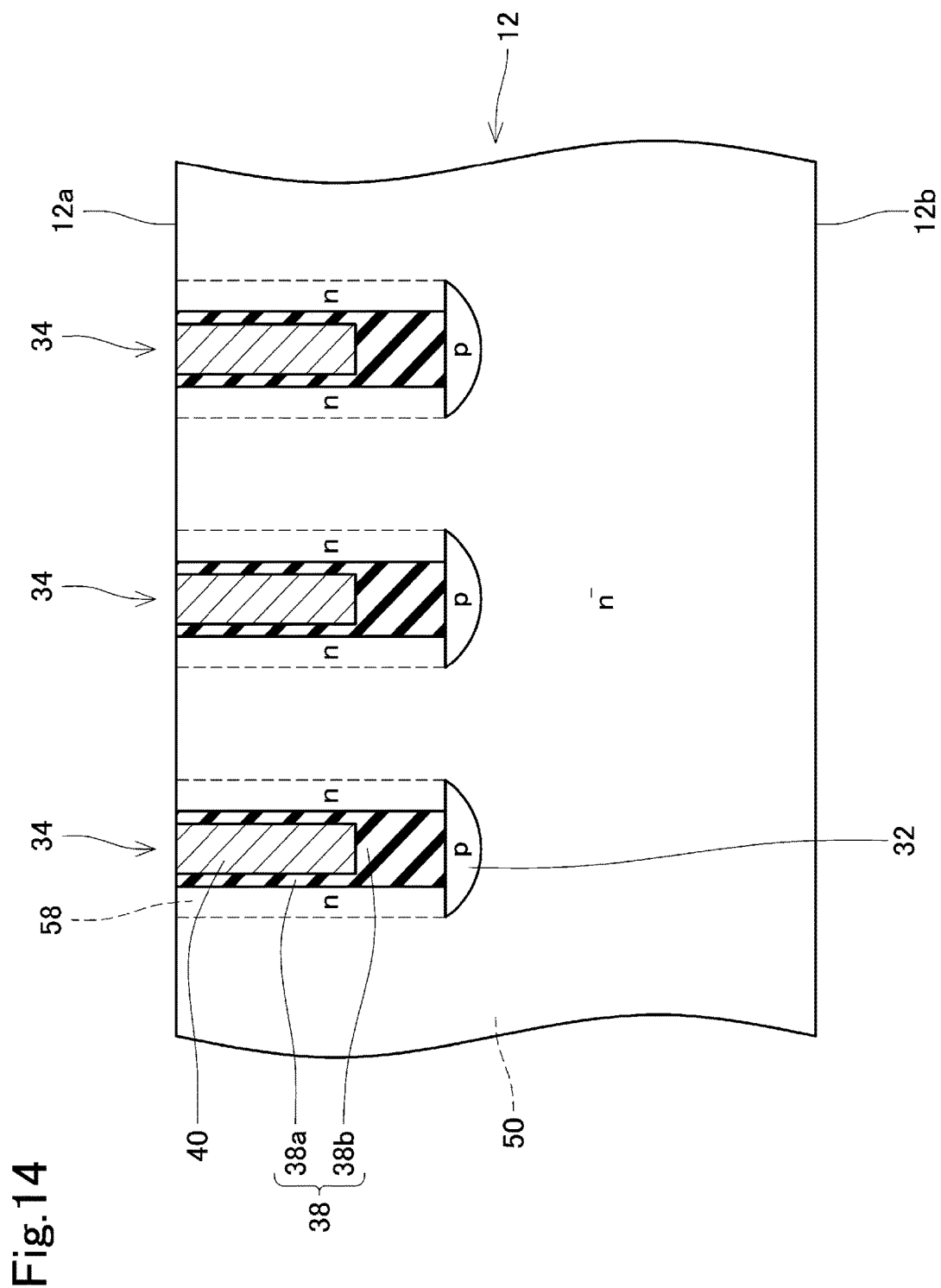
FIG. 14 is an illustrative diagram of the method for manufacturing the MOSFET in Embodiment 2.
Figure 15:
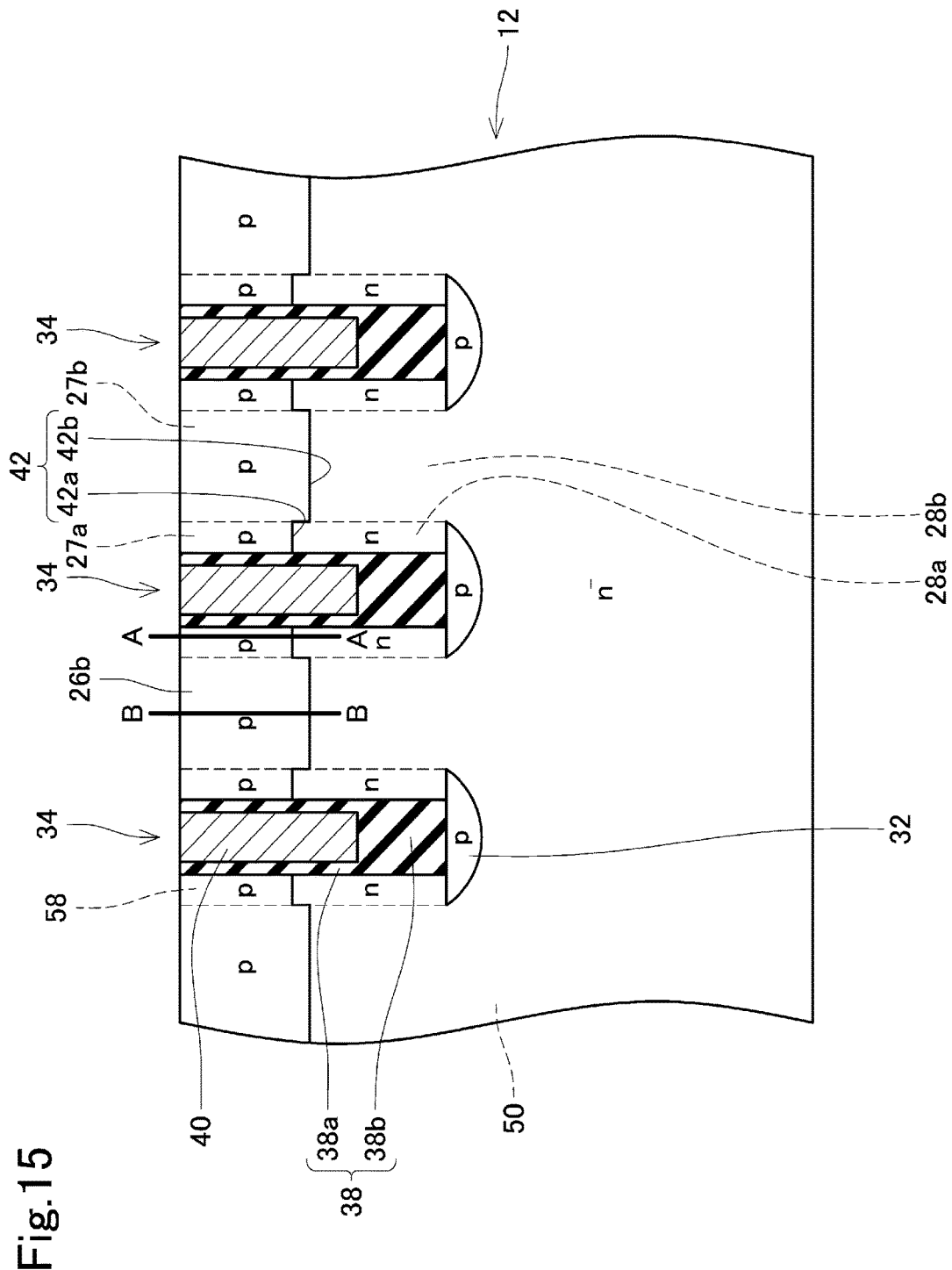
FIG. 15 is an illustrative diagram of the method for manufacturing the MOSFET in Embodiment 2.
Figure 16:
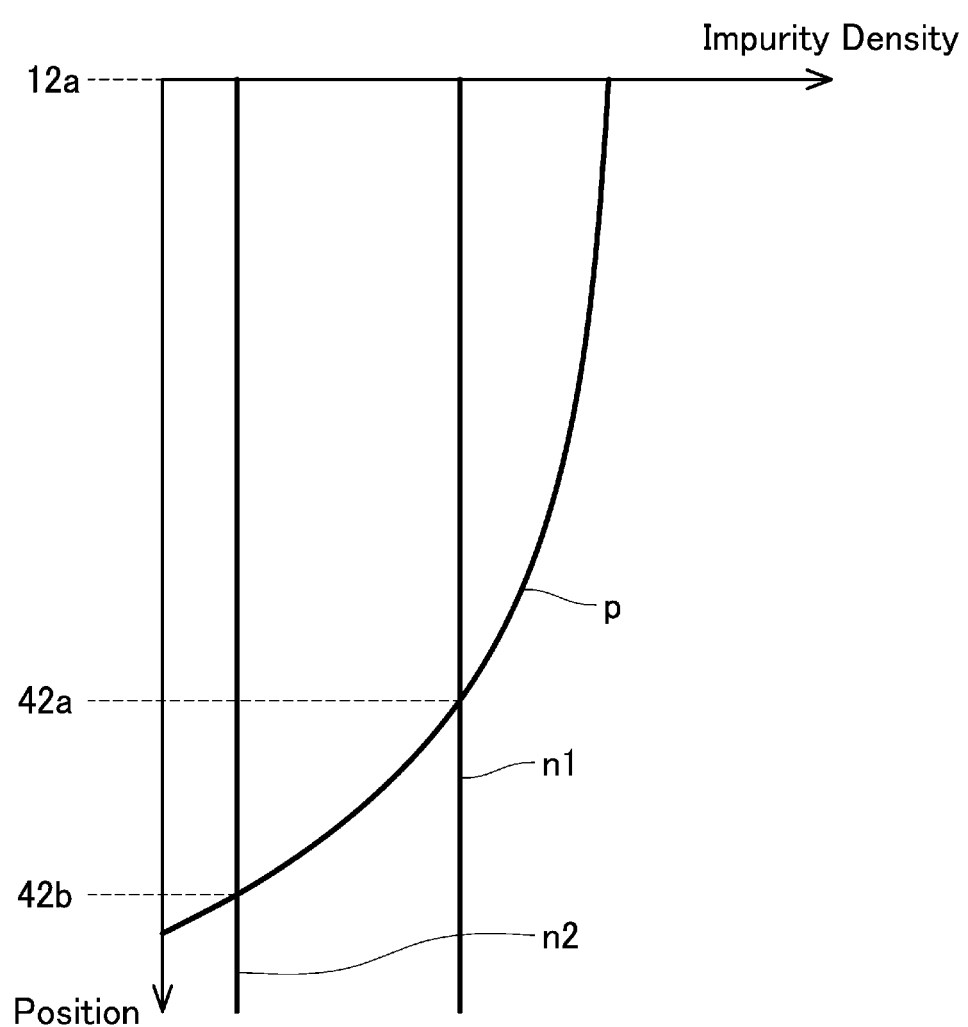
FIG. 16 is a diagram that shows an impurity density distribution on each of a line A-A and a line B-B in FIG. 15.

Next, a method for manufacturing the MOSFET in Embodiment 2 will be described. Initially, as in Embodiment 1, the wide-width trench forming step (FIG. 3) and the bottom surface ion implanting step (FIG. 4) are executed. Next, the epitaxially-growing step is executed. In the epitaxially-growing step in Embodiment 2, as shown in FIG. 12, the second SiC semiconductor layer 58 that has a density of n-type impurities higher than the density of n-type impurities in the first SiC semiconductor layer 50 is grown. Except for the fact that the second SiC semiconductor layer 58 has a high density of n-type impurities, the epitaxially-growing step in Embodiment 2 is the same as the epitaxially-growing step in Embodiment 1. Next, as shown in FIG. 13, the front surface of the SiC semiconductor substrate 12 is etched for planarization. Next, as shown in FIG. 14, as in Embodiment 1, the gate trench forming step, the gate insulating layer forming step, and the gate electrode forming step are executed. Next, as shown in FIG. 15, p-type impurities are implanted into the SiC semiconductor substrate 12 from the front surface 12a side, so as to form the low-density body region 26b. FIG. 16 shows an impurity density distribution at a position of each of a line A-A and a line B-B in FIG. 15. The line A-A is a position in the second SiC semiconductor layer 58, while the line B-B is a position in the first SiC semiconductor layer 50. In any of the positions of the line A-A and the line B-B, as shown in a graph p in FIG. 16, the density of p-type impurities is distributed so as to be decreased from the front surface 12a toward the lower side thereof. Moreover, at the position of the line A-A, as shown in a graph n1 in FIG. 16, the density of n-type impurities is distributed in an approximately constant density. Moreover, at the position of the line B-B, as shown in a graph n2 in FIG. 16, the density of n-type impurities is distributed in an approximately constant density lower than the density of n-type impurities at the position of the line A-A (in the graph n1). An intersection of the graph n1 and the graph p indicates the position of the lower end of the low-density body region 26b at the position of the line A-A (i.e., the pn junction 42a), while an intersection of the graph n2 and the graph p indicates the position of the lower end of the low-density body region 26b at the position of the line B-B (i.e., the pn junction 42b). The density of n-type impurities at the position of the line A-A is higher than the density of n-type impurities at the position of the line B-B, and hence, at the position of the line A-A, the lower end of the low-density body region 26b is resultantly located on an upper side with respect to the position of the line B-B. Accordingly, as shown in FIG. 15, the lower end of the gate adjacent portion 27a of the low-density body region 26b is located on an upper side with respect to the lower end of the gate non-adjacent portion 27b. After the low-density body region 26b is formed, the subsequent steps are executed as in Embodiment 1. The MOSFET in Embodiment 2 shown in FIG. 11 can thereby be manufactured.

Embodiment 3

Figure 17:
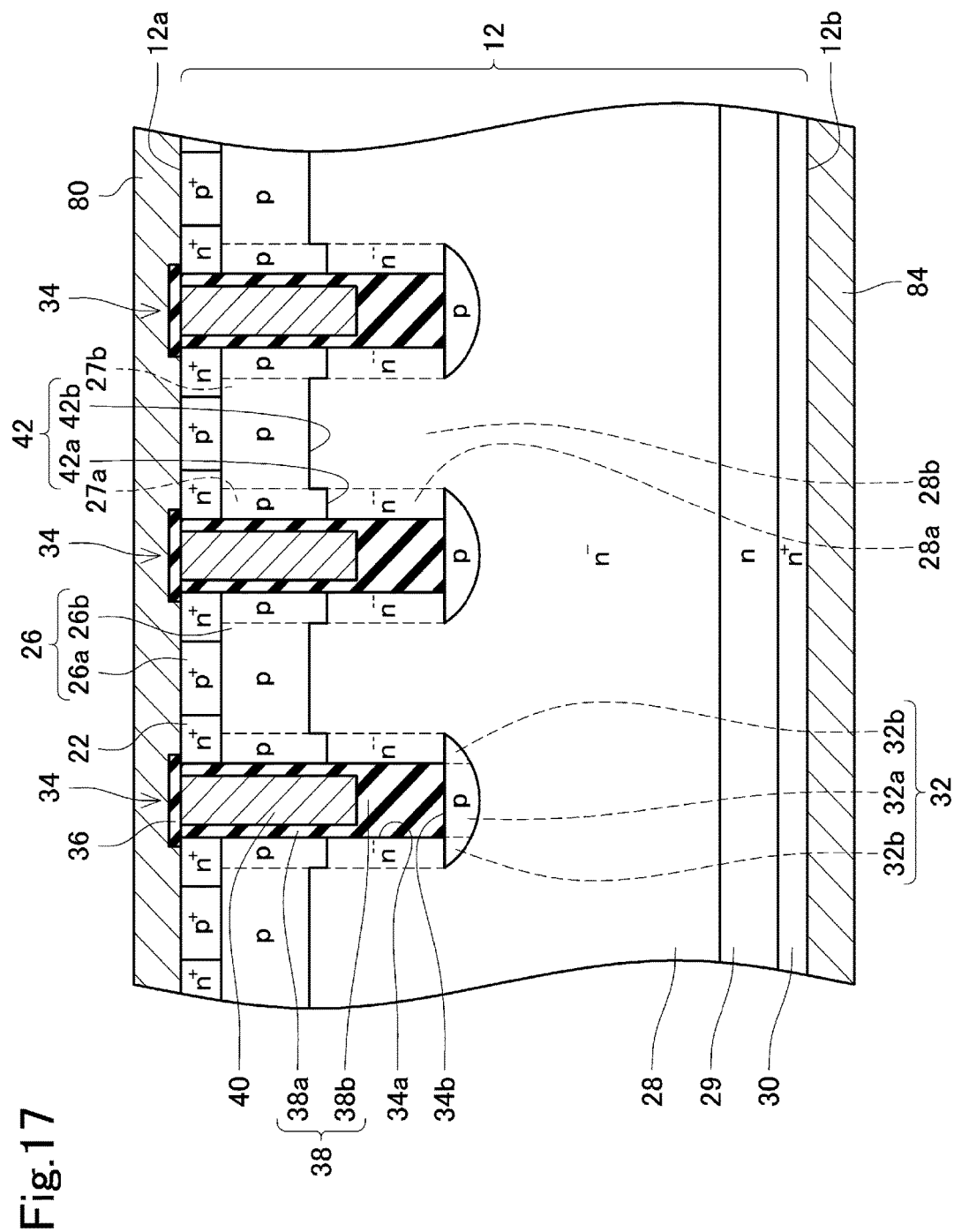
FIG. 17 is a longitudinal cross-sectional view of a MOSFET in Embodiment 3.

In a MOSFET in Embodiment 3 shown in FIG. 17, the density of n-type impurities in the gate adjacent portion 27a of the low-density body region 26b is lower than the density of n-type impurities in the gate non-adjacent portion 27b. The lower end of the gate adjacent portion 27a (i.e., the pn junction 42a at the boundary between the gate adjacent portion 27a and the drift region 28) is located on a lower side with respect to the lower end of the gate non-adjacent portion 27b (i.e., the pn junction 42b at the boundary between the gate non-adjacent portion 27b and the drift region 28). Moreover, the density of n-type impurities in the portion 28a of the drift region 28 that is in contact with the gate insulating layer 38 is lower than the density of n-type impurities in the portion 28b that is apart from the gate insulating layer 38.

In the MOSFET in Embodiment 3, the lower end of the gate adjacent portion 27a is located on the lower side with respect to the lower end of the gate non-adjacent portion 27b. Accordingly, an area in which the gate insulating layer 38 and the drift region 28 are in contact with each other is decreased. According to this structure, an electric field applied to the gate insulating layer 38 can more effectively be suppressed.

Moreover, the MOSFET in Embodiment 3 can be manufactured by changing the manufacturing method in Embodiment 2 to form the second SiC semiconductor layer 58 that has a density of n-type impurities lower than the density of n-type impurities in the first SiC semiconductor layer 50. By allowing the density of n-type impurities in the second SiC semiconductor layer 58 to be lower than the density of n-type impurities in the first SiC semiconductor layer 50, the lower end of the gate adjacent portion 27a can be located, in contrast to Embodiment 2, on the lower side with respect to the lower end of the gate non-adjacent portion 27b.

Embodiment 4

Figure 18:
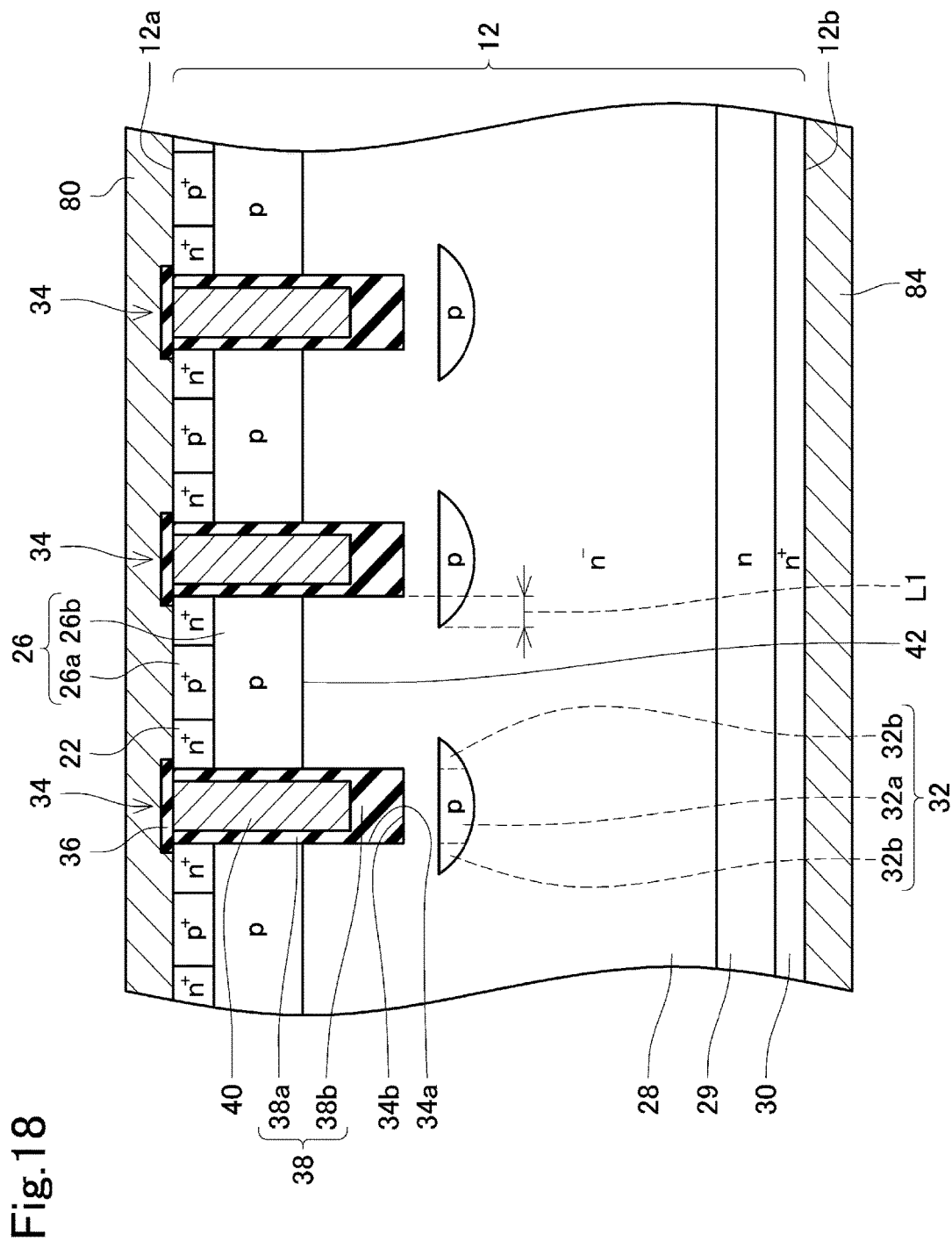
FIG. 18 is a longitudinal cross-sectional view of a MOSFET in Embodiment 4.

In a MOSFET in Embodiment 4 shown in FIG. 18, a spacing is provided between the electric field relaxation region 32 and the bottom surface 34b of the gate trench 34. The drift region 28 of n-type is formed in the spacing. Other configurations in the MOSFET in Embodiment 4 are the same as those in the MOSFET in Embodiment 1. As such, even in the case where a spacing is provided between the electric field relaxation region 32 and the bottom surface 34b of the gate trench 34, an electric field applied to the gate insulating layer 38 can be suppressed by the electric field relaxation region 32, as in the MOSFET in Embodiment 1.

Figure 19:
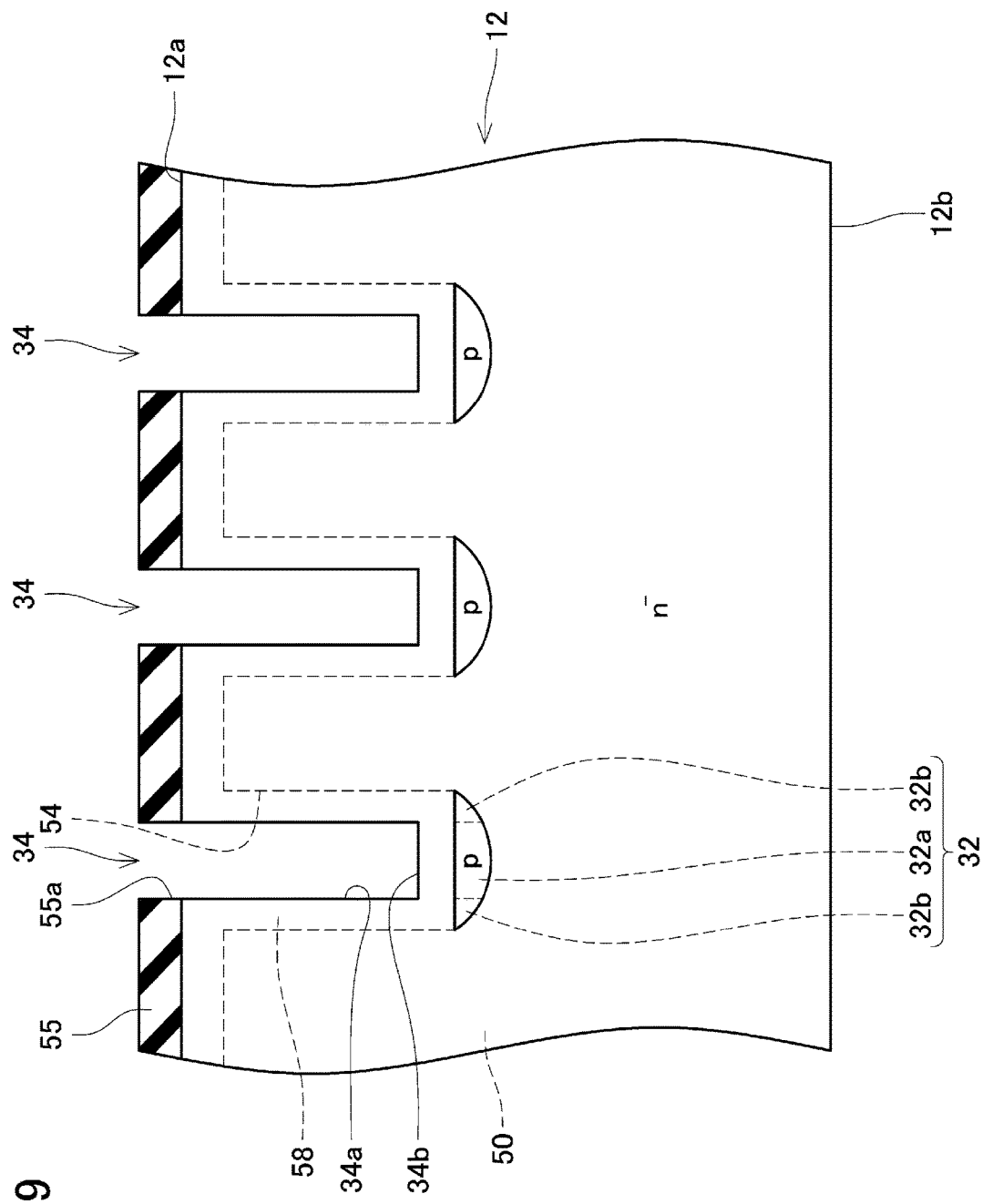
FIG. 19 is an illustrative diagram of a first method for manufacturing the MOSFET in Embodiment 4.

Moreover, in a method for manufacturing the MOSFET in Embodiment 4, as shown in FIG. 19, the gate trench 34 is formed, in the gate trench forming step, so as not to reach the electric field relaxation region 32. Other steps are executed as in Embodiment 1. The structure shown in FIG. 18 can thereby be obtained.

Figure 20:
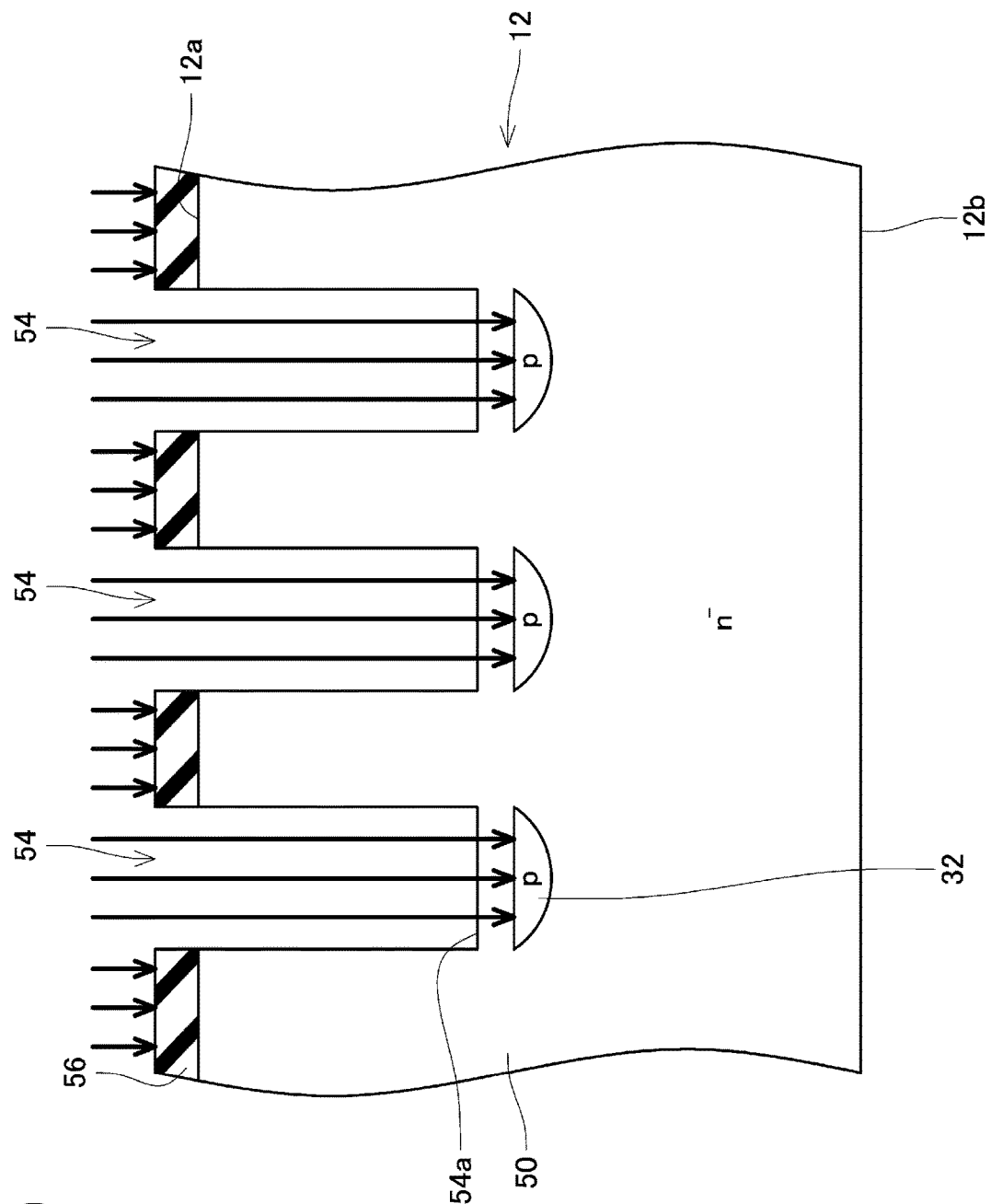
FIG. 20 is an illustrative diagram of a second method for manufacturing the MOSFET in Embodiment 4.

Moreover, the MOSFET in Embodiment 4 can also be manufactured by another method. In this manufacturing method, as shown in FIG. 20, p-type impurities are implanted with high energy into the bottom surface 54a of the wide-width trench 54 in the bottom surface ion implanting step. The p-type impurities are thereby implanted into a region on the much lower side with respect to the bottom surface 54a, resulting in a spacing between the electric field relaxation region 32 and the bottom surface 54a. By executing the subsequent steps as in the Embodiment 1, the structure shown in FIG. 18 can be obtained. Notably, if this manufacturing method is used, a distance between the low-density body region 26b and the electric field relaxation region 32 located thereunder can be made long. By making this distance long, a voltage that can be retained by the drift region 28 can be made high.

Notably, variations of the methods for manufacturing the MOSFETs described above will hereinafter be described. Notably, the variations described below can be applied to any of the MOSFETs in Embodiments 1 to 4.

(First Variation)

Figure 21:
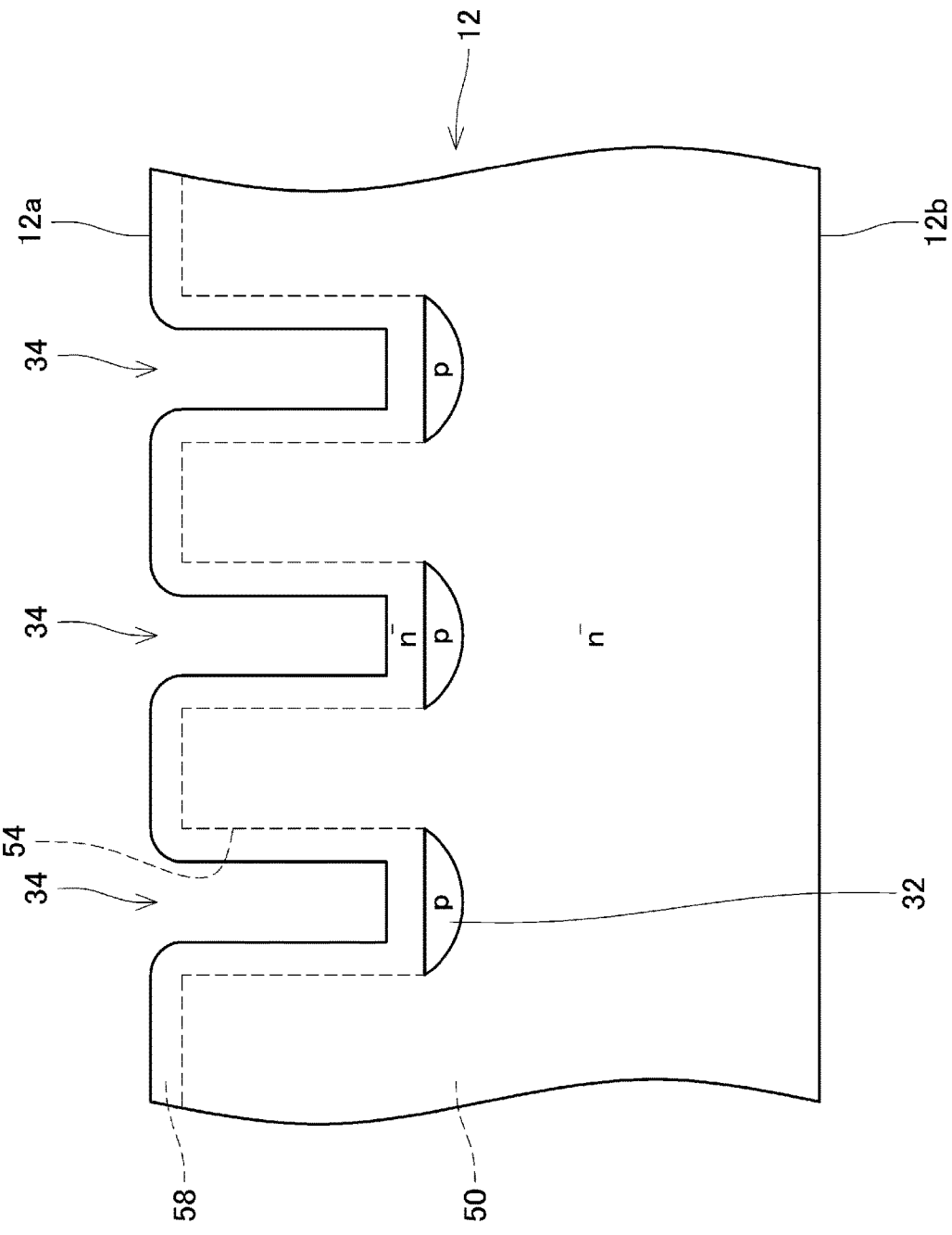
FIG. 21 is an illustrative diagram of a manufacturing method of a first variation.

In the manufacturing methods described above, as shown in FIG. 5 and the like, the wide-width trench 54 is filled with the second SiC semiconductor layer 58. However, as shown in FIG. 21, the width of the wide-width trench 54 may be narrowed by growing the second SiC semiconductor layer 58 such that a space is left inside the wide-width trench 54. The trench thus obtained by narrowing the width of the wide-width trench 54 can then be utilized as the gate trench 34.

(Second Variation)

Figure 22:
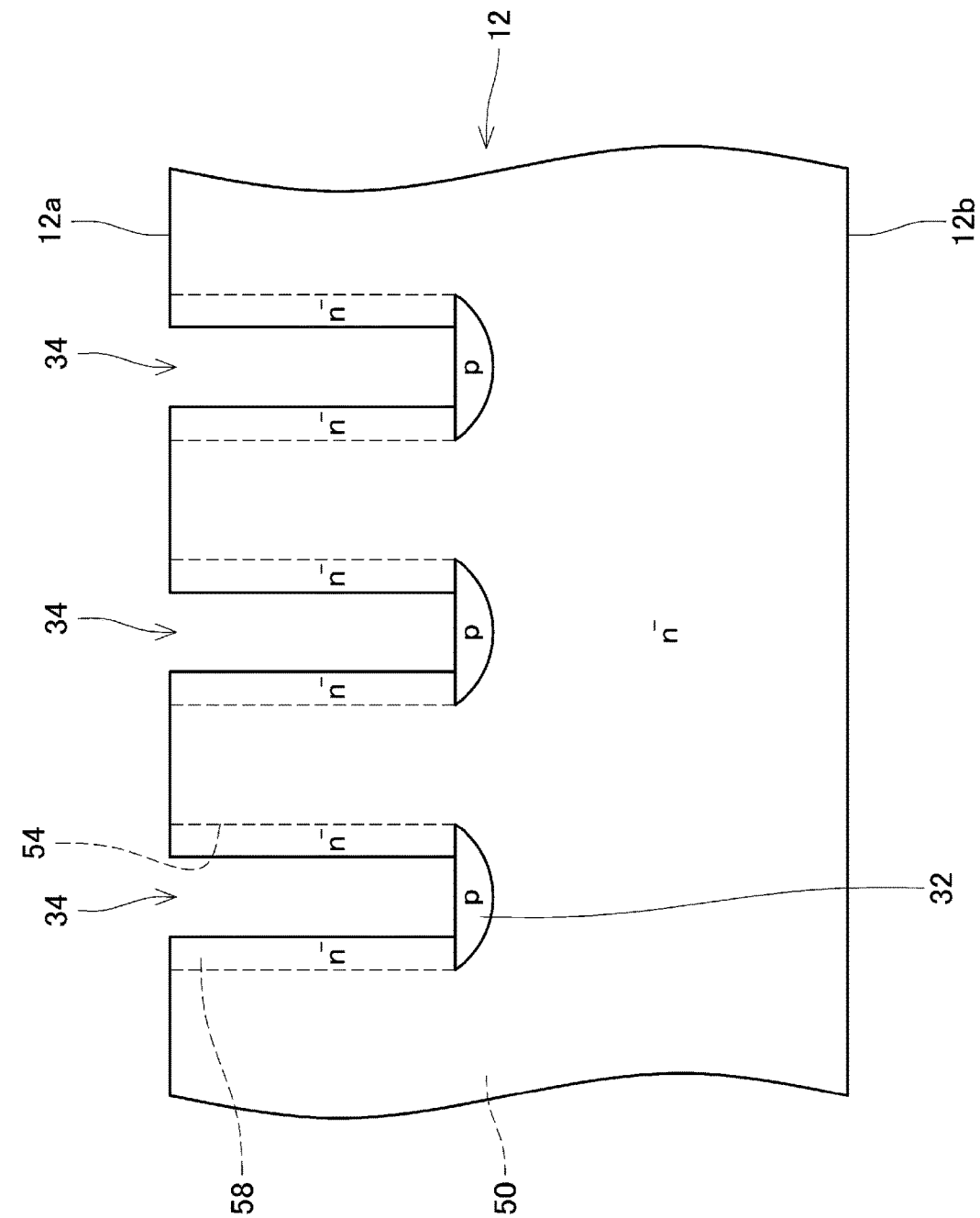
FIG. 22 is an illustrative diagram of a manufacturing method of a second variation.

In the first variation, the second SiC semiconductor layer 58 is grown isotropically on the inner surface of the wide-width trench 54 and on the front surface 12a of the SiC semiconductor substrate 12. However, as shown in FIG. 22, the second SiC semiconductor layer 58 may be grown exclusively on the lateral surface of the wide-width trench 54 by anisotropic epitaxial growth. In this method as well, the trench thus obtained by narrowing the width of the wide-width trench 54 can be utilized as the gate trench 34.

(Third Variation)

Figure 23:
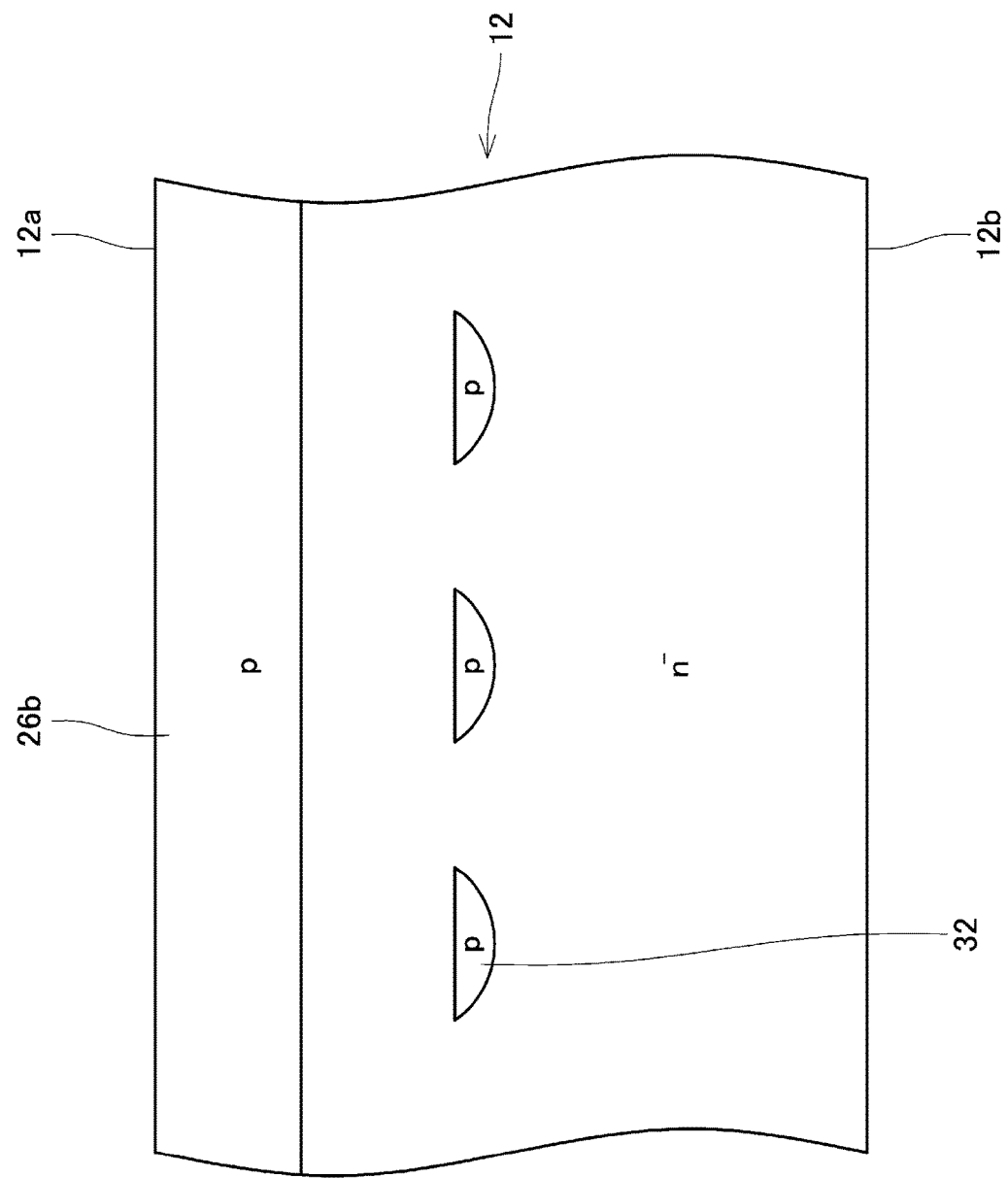
FIG. 23 is an illustrative diagram of a manufacturing method of a third variation.
Figure 24:
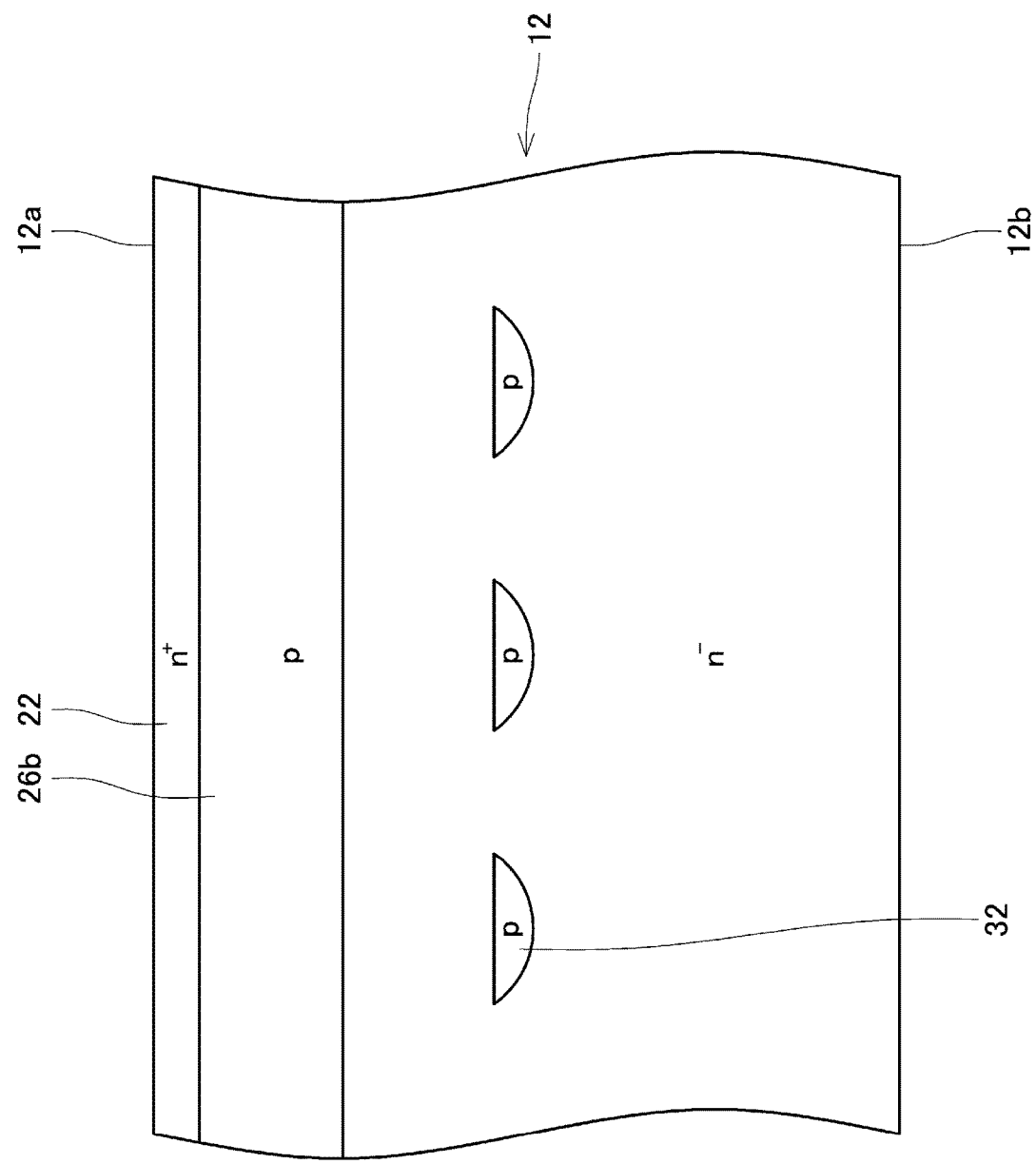
FIG. 24 is an illustrative diagram of the manufacturing method of the third variation.
Figure 25:
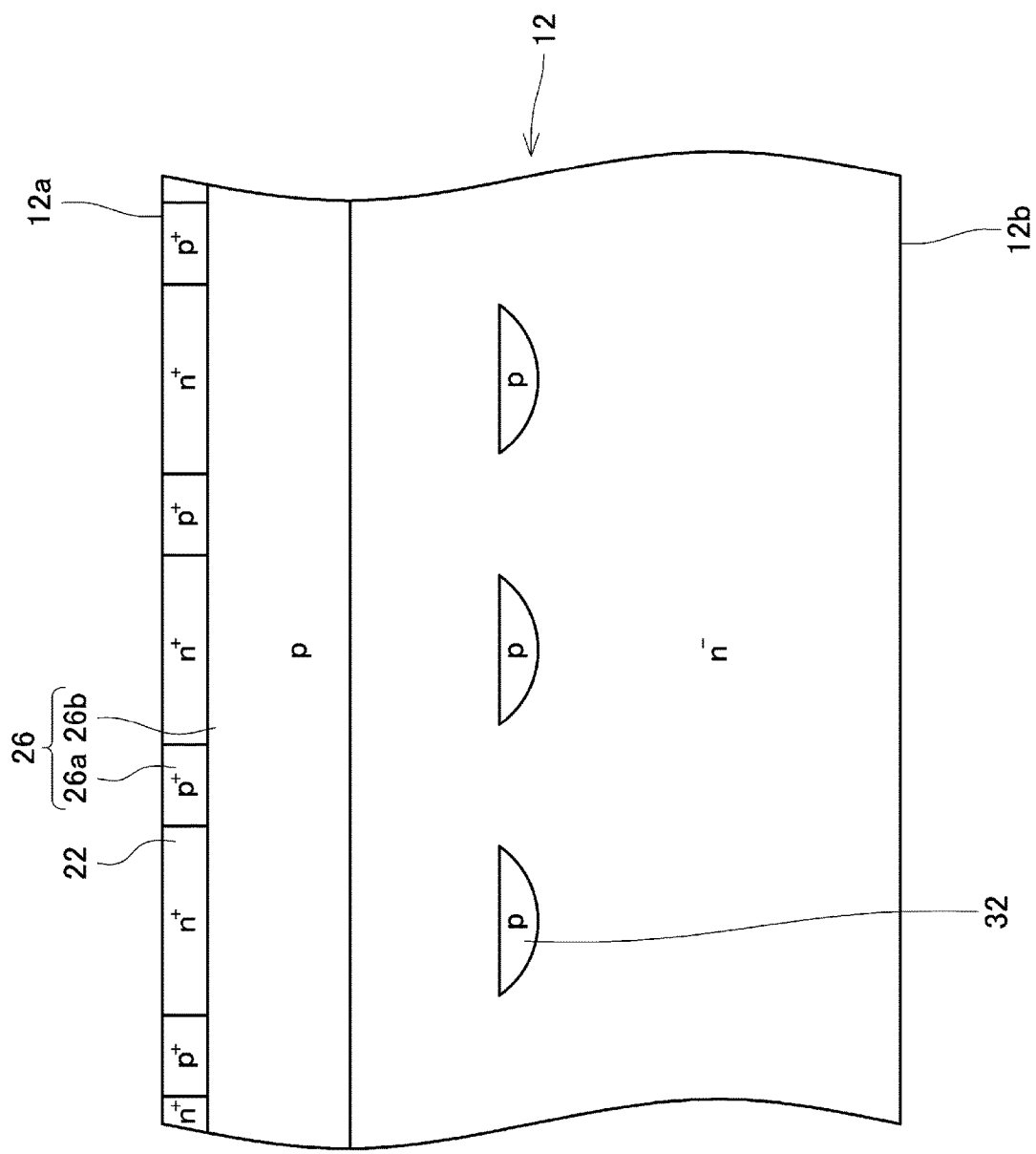
FIG. 25 is an illustrative diagram of the manufacturing method of the third variation.

In the above-described manufacturing methods, the low-density body region 26b, the contact region 26a, and the source region 22 are formed by ion implantation. However, when these regions are formed, epitaxial growth may be utilized. A third variation is a manufacturing method in which the source region 22 is formed by epitaxial growth. In the manufacturing method in the third variation, as shown in FIG. 23, the low-density body region 26b is formed by ion implantation after the execution of the wide-width trench forming step, the bottom surface ion implanting step, and the epitaxially-growing step. Next, as shown in FIG. 24, the source region 22 of n-type is formed on the low-density body region 26b by epitaxial growth. Next, as shown in FIG. 25, p-type impurities are selectively implanted into the source region 22, so as to form the contact region 26a. Next, as shown in FIG. 26, the gate trench 34 having a narrow width is formed in the front surface 12a of the SiC semiconductor substrate 12 so as to penetrate the source region 22 and the low-density body region 26b. Afterwards, necessary structures such as the gate insulating layer 38, the gate electrode 40, and the like can be formed so as to manufacture the MOSFET.

Notably, although the low-density body region 26b is formed by ion implantation in the third variation, the low-density body region 26b may be epitaxially grown. Moreover, if the low-density body region 26b is epitaxially grown, ion implantation may be executed into the low-density body region 26b so as to form the contact region 26a and the source region 22.

Moreover, in the above-described embodiments and variations, immediately after the implantation of p-type impurities into the bottom surface of the wide-width trench 54, the thermal treatment for activating the p-type impurities is performed. Moreover, after the implantation of the impurities into the low-density body region 26b, the contact region 26a, and the source region 22, the thermal treatment for activating the impurities thus implanted into these regions is performed. However, the timing at which such a thermal treatment for activating the impurities is executed can be changed as appropriate. Moreover, the thermal treatment for activating the impurities implanted into the bottom surface of the wide-width trench 54, and the thermal treatment for the low-density body region 26b, the contact region 26a, and the source region 22 may collectively be executed.

Moreover, in the above-described embodiments and variations, the MOSFETs have been described. However, the art disclosed herein may be applied to an IGBT. If the drain region 30 in the above-described MOSFETs is replaced by a collector region of p-type, an IGBT can be obtained.

Moreover, in the above-described embodiments and variations, the potential of the electric field relaxation region 32 is set to a floating potential. However, the electric field relaxation region 32 may be connected to a prescribed, fixed potential. For example, a conductive path that connects the electric field relaxation region 32 and the source electrode 80 may be provided at a position not shown, so as to connect the electric field relaxation region 32 to the potential of the source electrode 80.

Moreover, in the above-described embodiments and variations, the body region 26 has the contact region 26a (i.e., the p-type region having the high density of p-type impurities and in contact with the source electrode 80). However, the body region 26 may not have the contact region 26a. For example, the body region 26 may be configured solely with the low-density body region 26b.

The relation between the components in the above-described embodiments and the components in the claims will be described. The wide-width trench 54 in the embodiments is an example of the claimed first trench. The gate trench 34 in the embodiments is an example of the claimed second trench. The source region 22 in the embodiments is an example of the claimed first region. The drift region 28 in the embodiments is an example of the claimed second region.

Some of the technical elements disclosed herein will hereinafter be enumerated. Notably, each of the technical elements below is independently useful.

In a method disclosed herein as an example, a density of n-type impurities in the second SiC semiconductor layer may be higher than a density of n-type impurities in the first SiC semiconductor layer. In this example, the body region may be formed by implanting the p-type impurities into the first SiC semiconductor layer and the second SiC semiconductor layer.

According to this configuration, the lower end of the body region formed in the first SiC semiconductor layer is located on the lower side with respect to the lower end of the body region formed in the second SiC semiconductor layer. According to this configuration, the insulated gate switching device thus manufactured can achieve both of a low channel resistance and a high punch-through voltage.

In a method disclosed herein as another example, a density of n-type impurities in the second SiC semiconductor layer may be lower than a density of n-type impurities in the first SiC semiconductor layer. In this example, the body region may be formed by implanting the p-type impurities into the first SiC semiconductor layer and the second SiC semiconductor layer.

According to this configuration, the lower end of the body region formed in the first SiC semiconductor layer is located on the upper side with respect to the lower end of the body region formed in the second SiC semiconductor layer. According to this configuration, an electric field applied to the gate insulating layer can be more relaxed in the insulated gate switching device thus manufactured.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A method for manufacturing an insulated gate switching device, comprising:
   forming a first trench in a surface of a first SiC semiconductor layer being of n-type;
   implanting p-type impurities into a bottom surface of the first trench;
   depositing a second SiC semiconductor layer being of n-type on an inner surface of the first trench after implanting the p-type impurities so as to form a second trench above an implanted region of the p-type impurities, the second trench having a width narrower than a width of the first trench; and
   forming a gate insulating layer, a gate electrode, a first region and a body region so that the gate insulating layer covers an inner surface of the second trench, the gate electrode is located in the second trench, the first region is of n-type and in contact with the gate insulating layer, the body region is of p-type, separated from the implanted region, and in contact with the gate insulating layer under the first region.

2. The method of claim 1, wherein
   a density of n-type impurities in the second SiC semiconductor layer is higher than a density of n-type impurities in the first SiC semiconductor layer, and the body region is formed by implanting the p-type impurities into the first SiC semiconductor layer and the second SiC semiconductor layer.

3. The method of claim 1, wherein
a density of n-type impurities in the second SiC semiconductor layer is lower than a density of n-type impurities in the first SiC semiconductor layer, and
the body region is formed by implanting the p-type impurities into the first SiC semiconductor layer and the second SiC semiconductor layer.

4. The method of claim 1, wherein, in the formation of the second trench, the first trench is filled with the second SiC semiconductor layer, and then the second SiC semiconductor layer is etched so as to form the second trench.

5. The method of claim 1, wherein the second trench is formed by depositing the second SiC semiconductor layer on a lateral surface of the first trench so as to narrow the width of the first trench.

6. An insulated gate switching device, comprising:
a SiC semiconductor substrate having a surface in which a trench is provided;
a gate insulating layer covering an inner surface of the trench; and
a gate electrode located in the trench,
wherein
the SiC semiconductor substrate comprises:
    a first region being of n-type and in contact with the gate insulating layer;
    a body region being of p-type and in contact with the gate insulating layer under the first region;
    a second region being of n-type, in contact with the gate insulating layer under the body region, and separated from the first region by the body region; and
    an electric field relaxation region being of p-type, located below the trench, separated from the body region by the second region, and having a width wider than a width of the trench,
the body region comprises a first portion adjacent to the gate insulating layer and a second portion adjacent to the first portion on an opposite side from the gate insulating layer,
a density of n-type impurities in the first portion is higher than a density of n-type impurities in the second portion, and
a lower end of the first portion is located on an upper side with respect to a lower end of the second portion.

7. An insulated gate switching device, comprising:
a SiC semiconductor substrate having a surface in which a trench is provided;
a gate insulating layer covering an inner surface of the trench; and
a gate electrode located in the trench;
wherein
the SiC semiconductor substrate comprises:
    a first region being of n-type and in contact with the gate insulating layer;
    a body region being of p-type and in contact with the gate insulating layer under the first region;
    a second region being of n-type, in contact with the gate insulating layer under the body region, and separated from the first region by the body region; and
    an electric field relaxation region being of p-type, located below the trench, separated from the body region by the second region, and having a width wider than a width of the trench,
the body region comprises a first portion adjacent to the gate insulating layer and a second portion adjacent to the first portion on an opposite side from the gate insulating layer,
a density of n-type impurities in the first portion is lower than a density of n-type impurities in the second portion, and
a lower end of the first portion is located on a lower side with respect to a lower end of the second portion.

* * * * *